(12) United States Patent
Malladi

(10) Patent No.: US 12,395,171 B2
(45) Date of Patent: Aug. 19, 2025

(54) SWITCH CIRCUITS WITH PARALLEL TRANSISTOR STACKS AND CAPACITOR NETWORKS FOR BALANCING OFF-STATE RF VOLTAGES, AND METHODS OF THEIR OPERATION

(71) Applicant: NXP USA, Inc., Austin, TX (US)

(72) Inventor: Venkata Naga Koushik Malladi, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/449,486

(22) Filed: Sep. 30, 2021

(65) Prior Publication Data

US 2022/0038098 A1    Feb. 3, 2022

Related U.S. Application Data

(63) Continuation-in-part of application No. 16/944,612, filed on Jul. 31, 2020, now Pat. No. 11,368,180.

(51) Int. Cl.
*H03K 17/687* (2006.01)
*H04B 1/40* (2015.01)

(52) U.S. Cl.
CPC ........... *H03K 17/6871* (2013.01); *H04B 1/40* (2013.01)

(58) Field of Classification Search
CPC ............. H03K 17/6871; H03K 17/002; H03K 17/162; H03K 17/063; H04B 1/48
See application file for complete search history.

(56) References Cited

U.S. PATENT DOCUMENTS

| | | |
|---|---|---|
| 7,983,627 B2 | 7/2011 | Adler et al. |
| 8,008,988 B1 | 8/2011 | Yang et al. |
| 8,401,496 B2 | 3/2013 | Goto et al. |
| 8,536,636 B2 | 9/2013 | Englekirk |
| 9,438,223 B2 | 9/2016 | de Jongh |
| 9,484,973 B1 | 11/2016 | Carroll et al. |
| 9,595,951 B2 | 3/2017 | Sprinkle et al. |
| 9,866,209 B2 | 1/2018 | Keane et al. |
| 9,893,722 B2 | 2/2018 | Mokalla |

(Continued)

OTHER PUBLICATIONS

Shifrin, M. et.al; "High Power Control Components Using a New Monolithic FET Structure"; IEEE Microwave and Millimeter-Wave Monolithic Circuits Symposium Digest of Papers; 6 pages (1989).

(Continued)

*Primary Examiner* — Patrick C Chen
(74) *Attorney, Agent, or Firm* — Sherry W. Gourlay

(57) ABSTRACT

A switch circuit includes first and second transistor stacks coupled in parallel between first and second ports. The first transistor stack includes a first plurality of transistors coupled in series between the first and second ports to provide a first variably-conductive path between the first and second ports. A first network of one or more balancing capacitors includes a first capacitor coupled across multiple transistors of the first plurality of transistors. The second transistor stack includes a second plurality of transistors coupled in series between the first and second ports to provide a second variably-conductive path between the first and second ports. A second network of one or more balancing capacitors includes a second capacitor coupled across multiple transistors of the second plurality of transistors.

15 Claims, 9 Drawing Sheets

(56) References Cited

U.S. PATENT DOCUMENTS

| | | | |
|---|---|---|---|
| 10,326,440 B1* | 6/2019 | Malladi | H01L 28/20 |
| 10,897,246 B2 | 1/2021 | Scott et al. | |
| 2011/0316062 A1* | 12/2011 | Kondo | H01L 29/93 |
| | | | 257/E29.345 |
| 2012/0112832 A1 | 5/2012 | Kawano et al. | |
| 2013/0222075 A1* | 8/2013 | Reedy | H03H 7/38 |
| | | | 333/32 |
| 2013/0288617 A1 | 10/2013 | Kim et al. | |
| 2014/0340181 A1* | 11/2014 | Bakalski | H03J 5/244 |
| | | | 334/55 |
| 2015/0116023 A1 | 4/2015 | Keane et al. | |
| 2016/0020326 A1* | 1/2016 | Mazure | H01L 29/66795 |
| | | | 257/365 |
| 2016/0285447 A1 | 9/2016 | Krishnamurthi et al. | |
| 2017/0026031 A1* | 1/2017 | Levesque | H03H 7/1758 |
| 2018/0145678 A1* | 5/2018 | Maxim | H03K 17/102 |
| 2018/0183431 A1 | 6/2018 | Zhu et al. | |
| 2019/0140687 A1* | 5/2019 | Tombak | H03K 17/693 |
| 2019/0149142 A1 | 5/2019 | Scott et al. | |
| 2019/0245574 A1 | 8/2019 | Jo et al. | |

OTHER PUBLICATIONS

U.S. Appl. No. 16/566,710; not yet published; 40 pages (Sep. 10, 2019).

U.S. Appl. No. 16/701,927; not yet published; 42 pages (Dec. 3, 2019).

\* cited by examiner

SWITCH CIRCUITS WITH PARALLEL TRANSISTOR STACKS AND CAPACITOR NETWORKS FOR BALANCING OFF-STATE RF VOLTAGES, AND METHODS OF THEIR OPERATION

CROSS-REFERENCE TO RELATED APPLICATION

This application is a continuation-in-part of co-pending, U.S. patent application Ser. No. 16/944,612 filed on Jul. 31, 2020.

TECHNICAL FIELD

Embodiments of the subject matter described herein relate generally to RF switches, and methods for operating such RF switches.

BACKGROUND

Radio frequency (RF) switches are commonly used in communication transceivers to selectively connect transmitter and receiver circuitry to an antenna or other communication means. To configure the transceiver in a transmit state, an RF switch is controlled to provide a signal path between transmitter and antenna ports of the RF switch, while establishing a high impedance (e.g., open circuit) between the antenna and receiver ports of the RF switch. Conversely, to configure the transceiver in a receive state, the RF switch is controlled to provide a signal path between the antenna and receiver ports, while establishing a high impedance (e.g., open circuit) between the transmitter and antenna ports.

Some RF switches include stacks (i.e., series-coupled arrangements) of field effect transistors (FETs) between their transmit, receive, and antenna ports to achieve higher power handling capability. However, in high-power switches that include relatively large FET stacks, the settling time associated with switching between transmit and receive states may be relatively slow, thus limiting system performance. In addition, non-uniform RF voltage distribution across the FETs in a stack may result in a relatively low power handling capability for the stack. Conventional techniques for balancing the RF voltage distribution may result in undesirably high levels of leakage currents when the stack is in the off state, which may in turn lead to undesirably high signal losses. Accordingly, what are needed are RF switches that are characterized by faster settling times, and that are capable of withstanding higher off-state RF voltages, when compared with conventional RF switches.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter include radio frequency (RF) switches and transceivers for use in cellular base stations or other applications. In various embodiments, an RF switch includes at least one branch with multiple FET stacks arranged in parallel between switch ports (e.g., between the transmit and antenna ports, between the antenna and receive ports, and/or between a ground reference and the transmit port and/or receive port). During operation, an RF signal conveyed through a branch with parallel FET stacks is divided, and thus of relatively low power in each stack. Accordingly, given the same signal power conveyed through a branch, the FETs in the parallel FET stacks may be smaller in periphery, when compared with conventional RF switches that include only a single FET stack in a branch between switch ports. Further, because the relatively small FETs have lower gate capacitance, when compared with their larger counterparts, the time constants of the relatively small FETs also are smaller than the time constants of their larger counterparts. Accordingly, the settling time associated with switching between transmit and receive states may be relatively fast using implementations of the various embodiments, when compared with the settling times for conventional RF switches. This may enable systems to support faster and faster transmit/receive mode switching speeds, and thus higher data throughput.

In addition, at least some of the FET stacks include a capacitor network coupled between terminals of the transistors, and the capacitor network functions to balance RF voltages (or more generally, "AC voltages") across the transistors when the stack is in an off state. At least one capacitor in the capacitor network is coupled across multiple transistors in the stack, which may result in reduced off-state leakage currents, when compared with conventional stacks with capacitive balancing networks. This configuration enables the stack to withstand relatively high power signals with relatively low off-state leakage currents and associated signal losses.

Before describing RF switch embodiments in detail, examples of systems, devices, and modules in which such RF switch embodiments may be implemented are described in conjunction with FIGS. 1-4. It is to be understood that the later-described RF switch embodiments may be implemented in a wide variety of other systems, devices, modules, and circuits. Therefore, the example system, device, and module illustrated in FIGS. 1-4 are not to be construed as limiting the scope of the inventive subject matter.

Figure 1:
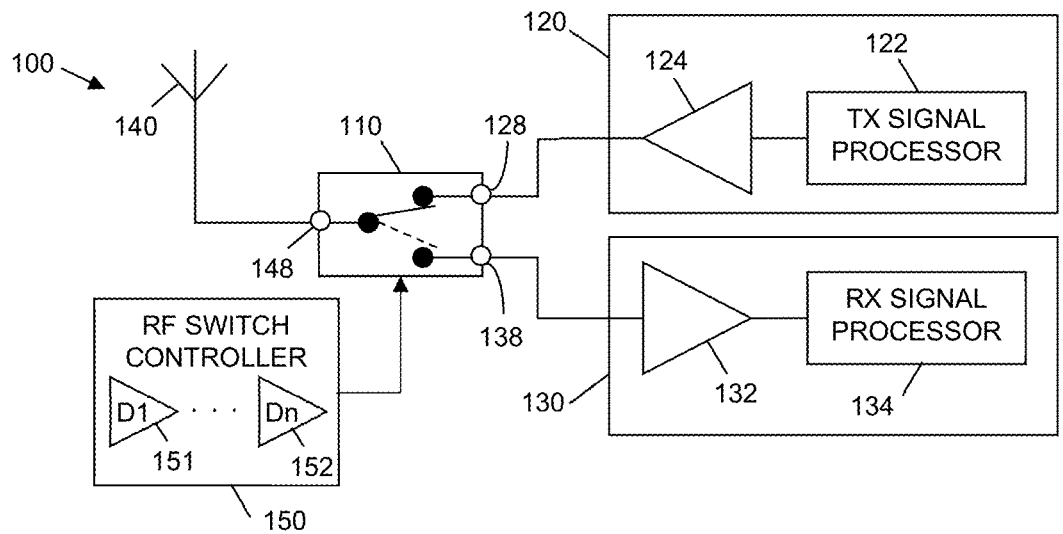
FIG. 1 is a simplified block diagram of an embodiment of a radio frequency (RF) transceiver system.

FIG. 1 is a simplified block diagram of an example of an RF transceiver system 100 that includes an RF switch 110, a transmitter 120, a receiver 130, an antenna 140, and an RF switch controller 150. Transceiver system 100 is a half-duplex transceiver, in which only one of the transmitter 120 or the receiver 130 are coupled, through the RF switch 110, to the antenna 140 at any given time. More specifically, the state of the RF switch 110 is controlled by RF switch controller 150 to alternate between coupling an RF transmit signal produced by the transmitter 120 to the antenna 140, or coupling an RF receive signal received by the antenna 140 to the receiver 130.

The transmitter 120 may include, for example, a transmit (TX) signal processor 122 and a power amplifier 124. The transmit signal processor 122 is configured to produce transmit signals, and to provide the transmit signals to the power amplifier 124. The power amplifier 124 amplifies the transmit signals, and provides the amplified transmit signals to the RF switch 110. The receiver 130 may include, for example, a receive amplifier 132 (e.g., a low noise amplifier) and a receive (RX) signal processor 134. The receive amplifier 132 is configured to amplify relatively low power received signals from the RF switch 110, and to provide the amplified received signals to the receive signal processor 134. The receive signal processor 134 is configured to consume or process the receive signals.

During each transmit time interval, when the transceiver 100 is in a "transmit mode," the RF switch controller 150 controls the RF switch 110 to be in a first or "transmit" state, as depicted in FIG. 1, in which a conductive transmit signal path is established between transmitter node 128 and antenna node 148, and in which a receive signal path is in a high impedance state (e.g., open circuit) between antenna node 148 and receiver node 138. Conversely, during each receive time interval, when the transceiver 100 is in a "receive mode," the RF switch controller 150 controls the RF switch 110 to be in a second or "receive" state, in which a conductive receive signal path, indicated by a dashed line in FIG. 1, is established between antenna node 148 and receiver node 138, and in which the transmit signal path is in a high impedance state (e.g., open circuit) between transmitter node 128 and antenna node 148.

According to an embodiment, the RF switch controller 150 includes up to n drivers, D1-Dn, 151, 152. As will be described in more detail later, n is the maximum number of parallel switches or FET stacks (e.g., parallel switches 531/532, 525/526, 631/632, 625/626, FIGS. 5, 6, 7A, 7C) in any branch of the RF switch 110, and each driver 151-152 is used to turn the FETs in a given stack on and off (i.e., to render the FET channels conducting or non-conducting). According to an embodiment, n may be any integer between 2 and 5, although n may be greater than 5, as well.

Figure 2:
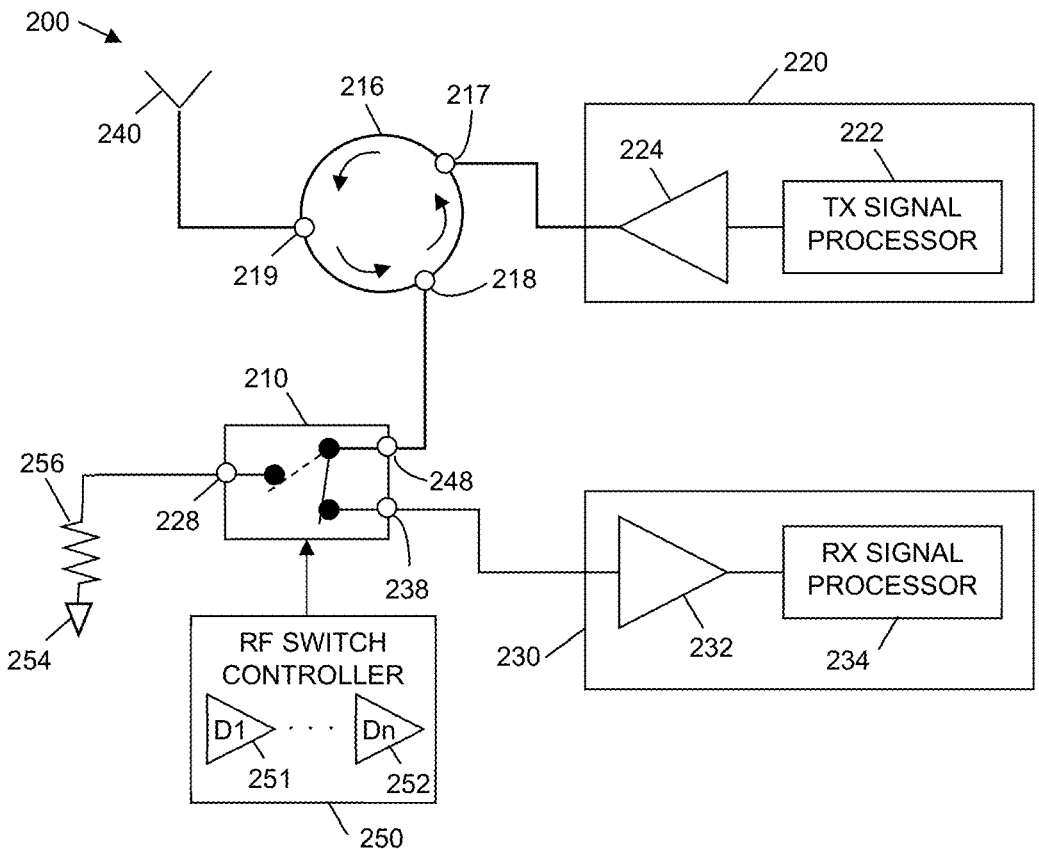
FIG. 2 is a simplified block diagram of another embodiment of an RF transceiver system.

FIG. 2 is a simplified block diagram of another example of RF transceiver system 200 that includes an RF switch 210, a circulator 216, a transmitter 220, a receiver 230, an antenna 240, and an RF switch controller 250. The transmitter 220 and the receiver 230 are coupled to the antenna 240 through the circulator 216. More specifically, the circulator 216 is a three-port device, with a first port 217 coupled to the transmitter 220, a second port 218 couplable to the receiver 230 through RF switch 210, and a third port 219 coupled to the antenna 240. The RF switch 210 also is a three-port device, with a first port 248 coupled to the receiver port 218 of the circulator 216, a second port 238 coupled to the receiver 230, and a third port 228 coupled to a ground reference node 254 through a resistor 256.

Again, the transmitter 220 may include, for example, a TX signal processor 222 and a power amplifier 224. The transmit signal processor 222 is configured to produce transmit signals, and to provide the transmit signals to the power amplifier 224. The power amplifier 224 amplifies the transmit signals, and provides the amplified transmit signals to the antenna 240 through the circulator 216. The receiver 230 may include, for example, a receive amplifier 232 (e.g., a low noise amplifier) and an RX signal processor 234. The receive amplifier 232 is configured to amplify relatively low power received signals received from the antenna 240 (through the circulator 216 and the RF switch 210), and to provide the amplified received signals to the receive signal processor 234. The receive signal processor 234 is configured to consume or process the receive signals.

The circulator 216 is characterized by a signal-conduction directivity, which is indicated by the arrows within the depiction of circulator 216. Essentially, RF signals may be conveyed between the circulator ports 217-219 in the indicated direction (counter-clockwise), and not in the opposite direction (clockwise). Accordingly, during normal operations, signals may be conveyed through the circulator 216 from transmitter port 217 to antenna port 219, and from antenna port 219 to receiver port 218, but not directly from transmitter port 217 to receiver port 218 or from receiver port 218 to antenna port 219.

In some situations, while the transceiver 200 is in the transmit mode, the circulator 216 may not be able to convey signal energy received through transmitter port 217 from the transmitter 220 to the antenna 240 through antenna port 219. For example, the antenna 240 may be disconnected from the antenna port 219, or may otherwise be in a very high impedance state. In such situations, the circulator 216 may convey signal energy from the transmitter 220 (i.e., signal energy received through transmitter port 217) past the antenna port 219 to the receiver port 218. To avoid conveying transmitter signal energy into the receiver 230 while the transceiver 200 is in the transmit mode, the RF switch controller 250 operates the RF switch 210 as a fail-safe switch by coupling the first port 248 to a ground reference node 254.

More specifically, when the transceiver 200 is in a receive mode, the RF switch 210 is controlled by RF switch controller 250 to be in a receive state, as shown in FIG. 2. In the receive state, the receiver port 218 of the circulator 216 is coupled through RF switch 210 to the receiver 230 (i.e., RF switch controller 250 configures RF switch 210 to have a conductive path between ports 248 and 238, and a high-impedance, open-circuit condition between ports 248 and 228). Conversely, when the transceiver 200 is in a transmit mode, the RF switch 210 is controlled by RF switch controller 250 to be in a transmit state, in which the receiver port 218 of the circulator 216 is coupled through the RF switch 210 to the ground termination 254 through resistor 256 (i.e., RF switch controller 250 configures RF switch 210 to have a conductive path, indicated by a dashed line in FIG. 2, between ports 248 and 228, and a high-impedance, open-circuit condition between ports 248 and 238). Accordingly, if the transmitter signal energy bypasses the antenna port 219 while the transceiver 200 is in the transmit mode, any signal energy that is conveyed through the receiver port 218 of the circulator 216 to the RF switch 210 will be shunted to the ground termination 254 through port 228 of the RF switch 210.

According to an embodiment, the RF switch controller 250 includes up to n drivers, D1-Dn, 251, 252. Again, as will be described in more detail later, n is the maximum number of parallel FET stacks (e.g., FET stacks 631/632 or stacks 625/626, FIGS. 6, 7A, 7C) in any branch of the RF switch 210, and each driver 251-252 is used to turn the FETs in a given stack on and off (i.e., to render the FET channels conducting or non-conducting). According to an embodiment, n may be any integer between 2 and 5, although n may be greater than 5, as well.

The RF transceiver systems 100, 200 (FIGS. 1, 2) may be physically implemented using a variety of active and passive electrical devices, which may be housed in one or more device packages and/or on one or more printed circuit boards (PCBs) and/or other substrates. More specifically, various components of the RF transceiver systems 100, 200 may be implemented in self-contained modules or electrical devices, which may be coupled to a substrate that electrically connects the module/devices to other portions of the RF transceiver system 100, 200. As used herein, the term "module" means a set of active and/or passive electrical devices (e.g., ICs and components) that are physically contained within a single housing (e.g., the device(s) are coupled to a common "module substrate" or within a single device package). A "module" also includes a plurality of conductive terminals for electrically connecting the set of devices to external circuitry that forms other portions of an electrical system. Essentially, the module substrate configuration, the method of coupling the device(s) to the module's terminals, and the number of devices within the module defines the module type. For example, in various embodiments, a module may be in the form of a PCB-based system, a surface mount device, a chip carrier device, a ball, pin, or land grid array device, a flat package device (e.g., a quad or dual flat no-lead package), a chip scale packaged device, a system-in-package (SiP) device, or in the form of some other type of integrated circuit package. Although two particular types of modules/devices are described below in conjunction with FIGS. 3 and 4, it is to be understood that embodiments of the inventive subject matter may be included in other types of modules/devices, as well.

Figure 3:
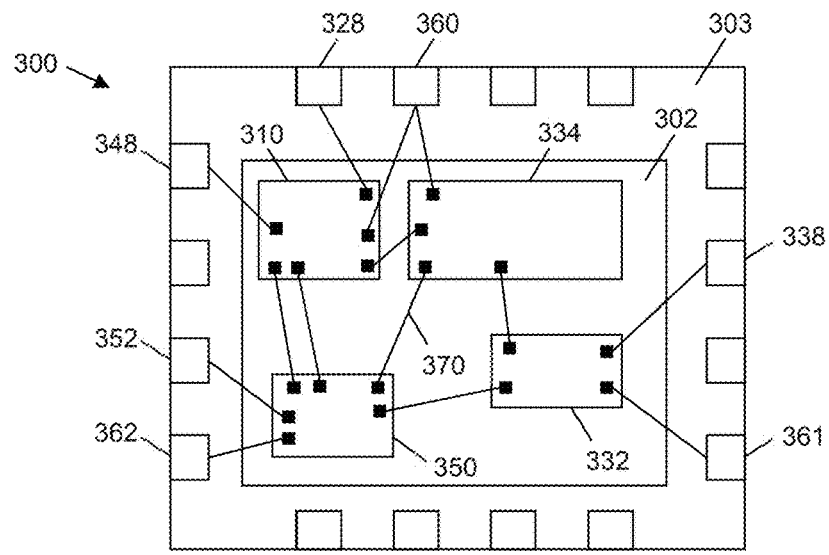
FIG. 3 is a top view of a surface mount device that embodies a portion of the RF transceiver system of FIG. 1 or FIG. 2, in accordance with an embodiment.

For example, FIG. 3 is a top view of a device 300 that embodies a portion of the RF transceiver system 100 of FIG. 1, in accordance with an embodiment. More specifically, FIG. 3 illustrates that portions of the transceiver may be packaged in a surface mount package. Device 300 is packaged as a quad flat no-lead (QFN) device, which includes a conductive pad 302 and a plurality of terminals (e.g., terminals 328, 338, 348, 352, 360, 361, 362) held in a fixed spatial relationship with non-conductive encapsulation 303 (e.g., plastic encapsulation). Device 300 also includes a plurality of ICs coupled to the conductive pad 302, including an RF switch integrated circuit (IC) 310 (e.g., an IC that embodies RF switch 110, FIG. 1), a receive amplifier IC 332 (e.g., receive amplifier 132, FIG. 1), a receive matching circuit IC 334, and an RF switch controller IC 350 (e.g., an IC that embodies RF switch controller 150, FIG. 1). In addition, device 300 includes a transmit signal input terminal 328 (e.g., corresponding to transmitter node 128, FIG. 1), a receive signal output terminal 338 (e.g., corresponding to receiver node 138, FIG. 1), an antenna terminal 348 (e.g., corresponding to antenna terminal 148, FIG. 1), a transmit/receive (TX/RX) control signal terminal 352, one or more ground terminals 360, 361, and one or more power terminals 362.

The various ICs 310, 332, 334, 350 and terminals 328, 338, 348, 352, 360-362 are electrically connected together through a plurality of wirebonds (e.g., wirebond 370). In other embodiments, various ones of the ICs 310, 332, 334, 350 and terminals 328, 338, 348, 352, 360-362 may be electrically connected together using other conductive structures. In various embodiments, the device 300 may be housed in an air-cavity package or an overmolded (e.g., encapsulated) package, although the device 300 may be considered to be complete without such packaging, as well.

After incorporation of device 300 into a transceiver system (e.g., system 100, FIG. 1), and during operation of the transceiver system, power and ground reference voltages may be provided to device 300 through power and ground terminals 360-362. RF switch controller IC 350 may receive transmit/receive mode control signals through a control signal terminal 352. Based on the received mode control signals, the RF switch controller IC 350 provides switch control signals to, or "drives", the control terminals (e.g., gates) of various transistors (e.g., transistors within branches 520, 524, 530, 534, 620, 624, 630, 634, 820, 824, 840, 834, FIGS. 5, 6, 7A, 7C, 8) of the RF switch IC 310. As will be described in more detail later, the switch control signals determine whether each of the various transistors is in a conducting or non-conducting state at any given time. More specifically, the switch control signals determine whether the RF switch IC 310 is in a transmit state (i.e., a state in which the switch is configured to convey an RF signal from the transmitter 120 to the antenna 140) or a receive state (i.e., a state in which the switch is configured to convey an RF signal from the antenna 140 to the receiver 130) at any given time.

When the switch control signals configure the RF switch IC 310 in the transmit state, transmit signals received by the RF switch IC 310 from a power amplifier (e.g., power amplifier 124, FIG. 1) through the transmit signal input terminal 328 are passed through the RF switch IC 310 to the antenna terminal 348. Conversely, when the switch control signals place the RF switch IC 310 in the receive state, signals received from the antenna terminal 348 are passed through the RF switch IC 310 to the receive matching circuit IC 334. The receive matching circuit IC 334 may include one or more integrated passive devices (e.g., capacitors, inductors, and/or resistors). The integrated passive devices, along with inductances of the wirebonds 370 between the receive matching circuit IC 334, the RF switch IC 310, and the receive amplifier IC 332, compose an impedance matching circuit between the RF switch IC 310 and the receive amplifier IC 332. In an alternate embodiment, the receive matching circuit IC 334 may be replaced by discrete components. Either way, the impedance matching circuit also may perform filtering of receive signals that pass from the RF switch IC 310 to the receive amplifier IC 332 through the impedance matching circuit. The receive amplifier IC 332 receives the receive signals from the receive matching circuit IC 334, and amplifies the receive signals. The receive amplifier IC 332 then provides the amplified receive signals to receive signal output terminal 338.

Figure 4:
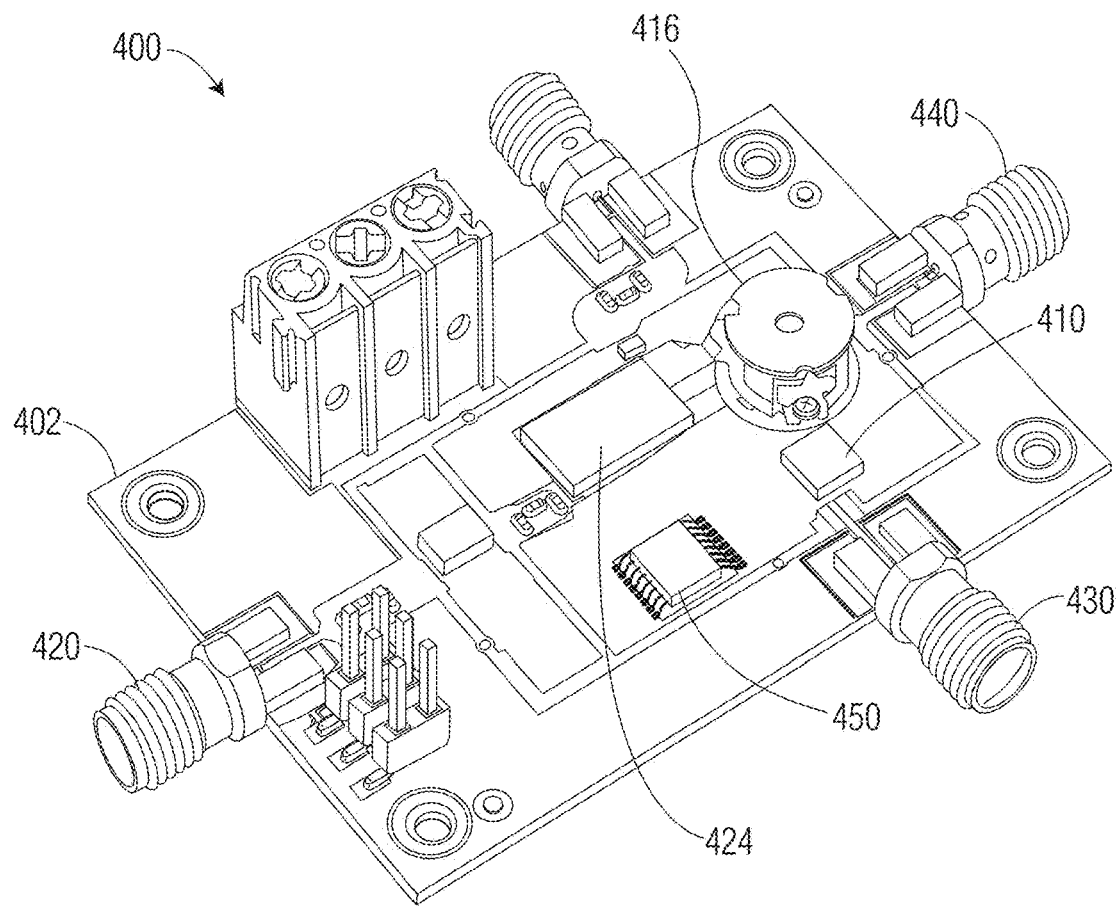
FIG. 4 is a top view of a module that embodies a portion of the RF transceiver system of FIG. 1 or FIG. 2, in accordance with an embodiment.

FIG. 4 is a perspective view of a module 400 that embodies a portion of the RF transceiver system 200 of FIG. 2, in accordance with an embodiment. More specifically, FIG. 4 illustrates that portions of the transceiver may be configured as a printed circuit board (PCB) module. The components of module 400 are mounted on (or coupled to) a system substrate 402, which may be, for example, a multi-layer PCB or other type of substrate. More specifically, module 400 includes a plurality of ICs and devices coupled to the system substrate 402, including a transmit amplifier module 424 (e.g., a module that embodies RF amplifier 224, FIG. 2), an RF switch and receive amplifier module 410 (e.g., a module that embodies RF switch 210 and the receive amplifier 232, FIG. 2), a circulator 416 (e.g., circulator 216, FIG. 2), and an RF switch controller IC 450 (e.g., an IC that embodies RF switch controller 250, FIG. 2). In addition, device 400 includes a transmit signal input connector 420 (e.g., corresponding to the input to amplifier 224, FIG. 2), a receive signal output connector 430 (e.g., corresponding to the output of amplifier 232, FIG. 2), and an antenna connector 440 (e.g., corresponding to an input to antenna 240, FIG. 2). The various ICs, devices, and connectors 410, 416, 420, 424, 430, 440, 450 are electrically connected together through a plurality of conductive traces on and within the system substrate 402.

After incorporation of module 400 into a transceiver system (e.g., system 200, FIG. 2), and during operation of the transceiver system, power and ground reference voltages may be provided to device 400 through power and ground terminals (not numbered). RF switch controller IC 450 may receive transmit/receive mode control signals through a control signal terminal (not numbered). Based on the received mode control signals, the RF switch controller IC 450 provides switch control signals to control terminals (e.g., gates) of various transistors (e.g., transistors within branches 520, 524, 530, 534, 620, 624, 630, 634, 820, 824, 840, 834, FIGS. 5, 6, 7A, 7C, 8) of the RF switch (e.g., RF switch 210, FIG. 2) within the RF switch and receive amplifier module 410. As will be described in more detail later, the switch control signals determine whether each of the various transistors is in a conducting or non-conducting state at any given time. More specifically, the switch control signals determine whether the RF switch within module 410 is in a transmit state or a receive state. When the RF switch is in the transmit state, the RF switch is configured to convey an RF signal from the circulator 416 to a ground reference terminal (e.g., node 254, FIG. 2). When the RF switch is in the receive state, the RF switch is configured to convey an RF signal from the circulator 216 to the receive amplifier (e.g., amplifier 232, FIG. 2) within module 410.

Those of skill in the art would understand, based on the description herein, that although the transceiver 100 of FIG. 1 is shown in FIG. 3 to be implemented as a surface-mount device (i.e., QFN device 300, FIG. 3), transceiver 100 alternatively could be implemented as a PCB-based module (e.g., similar to PCB-based module 400, FIG. 4). Similarly, those of skill in the art would understand, based on the description herein, that although the transceiver 200 of FIG. 2 is shown in FIG. 4 to be implemented as a PCB-based module (i.e., module 400, FIG. 4), transceiver 200 alternatively could be implemented as a surface-mount device (e.g., similar to QFN device 300, FIG. 3). Transceivers 100, 200 could be implemented and/or packaged in other forms, as well.

Figure 5:
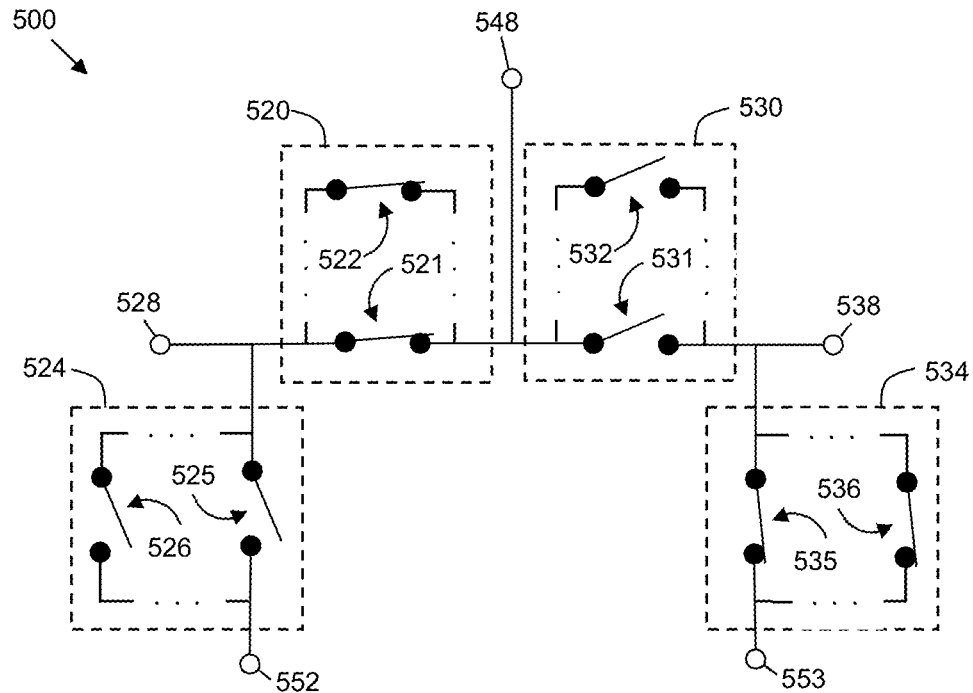
FIG. 5 is a simplified circuit diagram of an RF switch with parallel transistor stacks in all branches, in accordance with an embodiment.

Details regarding embodiments of an RF switch (e.g., RF switch 110, 210, FIGS. 1, 2) will now be discussed. In particular, FIG. 5 is a simplified circuit diagram of an RF switch 500, in accordance with an embodiment. RF switch 500 may provide the functionality of RF switch 110 (FIG. 1) and/or RF switch 210 (FIG. 2). RF switch 500 includes a plurality of input/output (I/O) ports, including a first port 528 (e.g., port 128, 228, FIGS. 1, 2), a second port 538 (e.g., port 138, 238, FIGS. 1, 2), a third port 548 (e.g., port 148, 248, FIGS. 1, 2), and voltage reference ports 552, 553, in an embodiment.

Further, RF switch 500 includes a plurality of "branches" 520, 524, 530, 534 electrically coupled between the various ports 528, 538, 548, 552, 553. As used herein, a switch "branch" includes the switching circuitry connected between any two ports of an RF switch. Accordingly, RF switch 500 is shown to include four branches, where a first branch 520 ("TX series branch") includes switch circuitry between ports 528 and 548, a second branch 524 ("TX shunt branch") includes switch circuitry between ports 528 and 552, a third branch 530 ("RX series branch") includes switch circuitry between ports 538 and 548, and a fourth branch 534 ("RX shunt branch") includes switch circuitry between ports 538 and 553.

Figure 6:
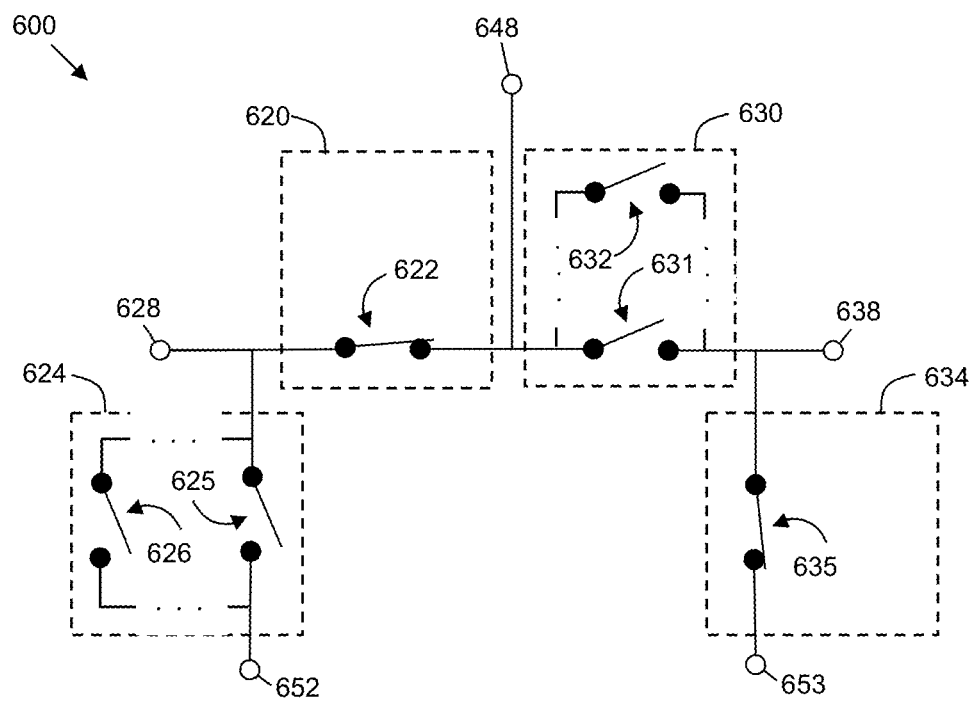
FIG. 6 is a simplified circuit diagram of an RF switch with parallel transistor stacks in a subset of branches, in accordance with an embodiment.

According to the illustrated embodiment, each branch 520, 524, 530, 534 includes multiple parallel-coupled "switches" 521/522, 525/526, 531/532, 535/536. In the context of FIGS. 5 and 6, the term "switch", as it applies to each of elements 521, 522, 525, 526, 531, 532, 535, 536, 622, 625, 626, 631, 632, and 635, may mean a single active switching device (e.g., a single FET) or a plurality of active switching devices (e.g., multiple FETs) that are coupled in series between two ports of an RF switch, thus comprising a "stack" of FET switches, or a "FET stack," as will be defined later. In the embodiment illustrated in FIG. 5, each branch 520, 524, 530, 534 is shown to include two parallel-coupled switches. However, as indicated by the ellipses between each parallel-coupled set of switches, each branch 520, 524, 530, 534 may include more than two parallel-coupled switches. For example, each branch 520, 524, 530, 534 may include from 2 to n branches, where n may be any integer between 2 and 5. In other embodiments, n may be greater than 5. As will be described in more detail later, the maximum number of parallel-coupled switches in any branch 520, 524, 530, 534 is equal to the number of drivers in the RF switch controller (e.g., drivers 151, 152, 251, 252, FIGS. 1, 2).

In some embodiments, the number of parallel-coupled switches in each branch 520, 524, 530, 534 may be the same (e.g., each branch 520, 524, 530, 534 may include two parallel-coupled switches). In other embodiments, the number of parallel-coupled switches in each branch 520, 524, 530, 534 may be different (e.g., branches 520 and 534 each may include two parallel-coupled switches, and branches 524 and 530 each may include three parallel-coupled switches). In still other embodiments, some branches may include multiple parallel-coupled switches, while other branches may include only a single switch.

For example, FIG. 6 is a simplified circuit diagram of an RF switch 600 with parallel switches in only a subset of branches 624, 630, in accordance with an embodiment, while other branches 620, 634 include only a single switch. Similar to RF switch 500 (FIG. 5), RF switch 600 also includes a plurality of I/O ports, including a first port 628 (e.g., port 128, 248, FIGS. 1, 2), a second port 638 (e.g., port 138, 238, FIGS. 1, 2), a third port 648 (e.g., port 148, 228, FIGS. 1, 2), and voltage reference ports 652, 653, in an embodiment.

According to the illustrated embodiment, each of branches 620 and 634 includes only a single switch 622, 635, whereas each of branches 624, 630 includes multiple parallel-coupled switches 625/626, 631/632. In the embodiment illustrated in FIG. 6, each branch 624, 630 is shown to include two parallel-coupled switches. However, as indicated by the ellipses between each parallel-coupled set of switches, each branch 624, 630 may include more than two parallel-coupled switches. For example, each branch 624, 630 may include from 2 to n parallel-coupled switches, where n may be any integer between 2 and 5. In other embodiments, n may be greater than 5. As will be described in more detail later, the maximum number of parallel-coupled switches in either of branches 624 or 630 may be equal to the number of drivers in the RF switch controller (e.g., drivers 151, 152, 251, 252, FIGS. 1, 2). Further, the number of parallel-coupled switches in branches 624 and 630 may be equal or unequal.

Although FIG. 6 shows parallel-coupled switches 625/626, 631/632 in two specific branches 624, 630, in other embodiments, parallel-coupled switches may be implemented in only a single branch (e.g., only branch 620, 624, 630, or 634), while each other branch includes only a single switch. In still other embodiments, parallel-coupled switches may be implemented in some other subset of branches (e.g., in branches 620/624, 620/630, 620/634, 620/624/630, 620/624/634, 620/630/634, 624/634, or 630/634), while each other branch includes only a single switch. Either way, in some embodiments, the number of parallel-coupled switches in each branch may be the same, whereas in other embodiments, the number of parallel-coupled switches in each branch may be different.

If either of RF switches 500, 600 were implemented in the transceiver 100 of FIG. 1, for example, port 528/628 may correspond to port 128, and thus may be coupled to transmitter 120. Port 538, 638 may correspond to port 138, and thus may be coupled to receiver 130. Port 548, 648 may correspond to port 148, and thus may be coupled to antenna 140. Finally, ports 552, 553, 652, 653 may be coupled to ground reference nodes. In an alternate embodiment, if either of RF switches 500, 600 were implemented in the transceiver of FIG. 1, port 528/628 may correspond to port 138, and thus may be coupled to receiver 130, and port 538, 638 may correspond to port 128, and thus may be coupled to transmitter 120.

Conversely, if either of RF switches 500, 600 were implemented in the transceiver 200 of FIG. 2, for example, port 548/648 may correspond to port 248, and thus may be coupled to the receiver port 218 of circulator 216. Port 538, 638 may correspond to port 238, and thus may be coupled to receiver 230. Port 528, 628 may correspond to port 228, and thus may be coupled to ground reference node 254 through resistor 256. Finally, ports 552, 553, 652, 653 also may be coupled to ground reference nodes. In an alternate embodiment, if either of RF switches 500, 600 were implemented in the transceiver of FIG. 2, port 528/628 may correspond to port 238, and thus may be coupled to receiver port 218 of circulator 216, and port 538, 638 may correspond to port 228, and thus may be coupled to ground reference node 254 through resistor 256.

Figure 7A:
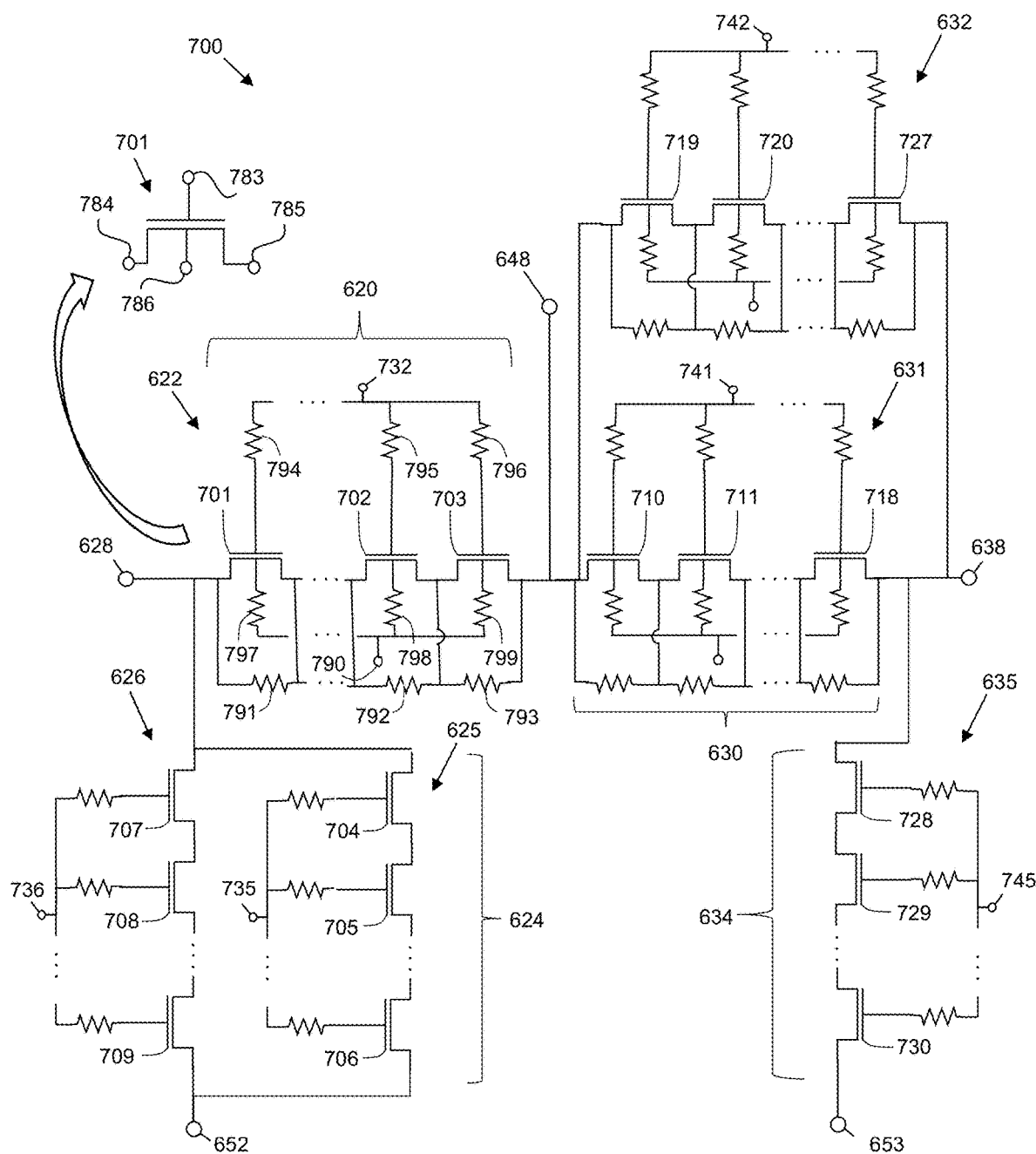
FIG. 7A is a more detailed circuit diagram of the RF switch of FIG. 6, in accordance with an embodiment.

To illustrate various aspects of the inventive subject matter in more detail, FIG. 7A depicts a detailed circuit diagram of an embodiment of an RF switch 700 that corresponds to the RF switch 600 of FIG. 6. In FIG. 7A, elements that correspond to the same elements in FIG. 6 have the same reference number (e.g., ports 628, 638, 648, 652, 653, branches 620, 624, 630, 634, and switches 622, 625, 626, 631, 632, 635).

As used herein, the terms "stack" and "FET stack" refer to multiple FETs that are coupled in series with each other (or "series-coupled") between two ports of an RF switch. Each stack may be considered to be a "switch" or a "variably-conductive path", in that the conductivity of a signal through the stack (or more specifically through the series of channels of the FETs in the stack) can be controlled or varied (i.e., increased or decreased) based on control signals provided at the stack control terminals (e.g., terminals 732, 735, 736, 741, 742, 745, FIGS. 7A, 7C). In other words, a stack (or switch or variably-conductive path) can be placed in a low-impedance state (e.g., closed, "on state" or "on-state") or a high-impedance state (e.g., open, "off state" or "off-state") based on control signals provided at the stack control terminal. Further, the terms "coupled in series" and "series-coupled," in reference to the electrical coupling between multiple FETs in a stack, means that the current-conducting terminals (e.g., source/drain terminals) of the multiple FETs are connected together to provide a continuous electrically conductive channel/path between a first port (e.g., port 628, 728, FIGS. 6, 7A) and a second port (e.g., port 648, 748, FIGS. 6, 7A) when the multiple FETs are in a conducting state (e.g., "on" or "closed"). Although the description herein refers to series-coupled arrangements in which a first FET has a drain terminal connected to a node, and has a source terminal connected to a drain terminal of a second FET, the source and drain terminal connections could be reversed, in other embodiments (e.g., a series-coupled arrangement may have a first FET with a source terminal connected to a node, and a drain terminal connected to a source terminal of a second FET). More generally, each of the source and drain terminals of a FET may be referred to as a "current-conducting terminal," and that term could be used interchangeably for either a source terminal or a drain terminal. Also, when two FETs are coupled in the above manner (i.e., the source of one FET in a stack is connected to the drain of another FET in the stack), these two FETs may be considered to be "adjacent" to each other.

According to an embodiment, in FIGS. 5, 6, 7A, and 7C, each switch 521, 522, 525, 526, 531, 532, 535, 536, 622, 625, 626, 631, 632, 635 is implemented as a stack of series-coupled FETs 701-703, 704-706, 707-709, 710-718, 719-727, 728-730 that is electrically coupled between two ports. In branches that include only a single switch (e.g., branches 620, 634, FIGS. 6, 7A), a single stack of series-coupled FETs is electrically coupled between the respective ports, whereas in branches that include multiple, parallel-coupled switches (e.g., branches 520, 524, 530, 534, 624, 630), multiple stacks of series-coupled FETs are electrically coupled between the respective ports.

According to the embodiment illustrated in FIGS. 6 and 7A, branch 620 includes a single switch 622, which may be implemented as a first stack of series-coupled FETs 701, 702, 703 that are electrically coupled between port 628 and port 648. Branch 624 includes two, parallel-coupled switches 625, 626, which may be implemented as second and third stacks of series-coupled FETs 704, 705, 706 and 707, 708, 709, respectively, that are electrically coupled between port 628 and port 652. Branch 630 also includes two, parallel-coupled switches 631, 632, which may be implemented as fourth and fifth stacks of series-coupled FETs 710-718 and 719-727, respectively, that are electrically coupled between port 638 and port 648. Finally, branch 634 includes a single switch 635, which may be implemented as a sixth stack of series-coupled FETs 728, 729, 730 that are electrically coupled between port 638 and port 653. When incorporated into a larger electrical system, ports 652 and 653 typically would be coupled to a ground reference (e.g., zero volts), although ports 652 and 653 alternatively could be coupled to a positive or negative DC voltage reference, as well.

As best depicted in the enlarged view of FET 701 in the upper left corner of FIG. 7A, each FET 701-730 includes a drain terminal (e.g., terminal 784 of FET 701), a source terminal (e.g., terminal 785 of FET 701), and a gate terminal (e.g., gate terminal 783 of FET 701). According to some embodiments, each FET 701-730 also may include a body bias terminal 786, which enables a DC bias voltage to be provided to the FET body. The electrical conductivity of a variable-conductivity channel between the source and drain terminals of any given FET is controlled by control signals provided to the FET's gate terminal (e.g., terminal 783). Some (and possibly all) of the above-discussed FETs may be "single-gate FETs", although some or all of the FETs may be "multiple-gate FETs", as well. Essentially, as will be described in more detail in conjunction with FIG. 9, a single-gate FET is a monolithic transistor device that includes a variable-conductivity channel between drain and source terminals, along with only one gate positioned over the channel. Conversely, as will be described in more detail in conjunction with FIG. 10, a multiple-gate FET is a monolithic transistor device that includes a variable-conductivity channel between drain and source terminals, along with multiple gates positioned over the channel. Electrical signals provided to the multiple gates control the conductivity of the channel during operation of the FET. In some applications, utilization of multiple gates may enable better electrical control over the channel, when compared with single-gate FETs. This, in turn, may enable more effective suppression of "off-state" leakage current, and/or enhanced current in the "on" state (i.e., drive current).

In the series-coupled sequence of multiple-gate FETs corresponding to switch 622, the drain terminal 784 of FET 701 may be coupled to port 628, the source terminal 785 of FET 701 may be coupled to the drain terminal of FET 702, the source terminal of FET 702 may be coupled to the drain terminal of FET 703, and the source terminal of FET 703 may be coupled to port 648. Although the description herein refers to series-coupled arrangements in which a first FET has a drain terminal connected to a port, and has a source terminal connected to a drain terminal of a second FET, the source and drain terminal connections could be reversed, in other embodiments (e.g., a series-coupled arrangement may have a first FET with a source terminal connected to a port, and a drain terminal connected to a source terminal of a second FET). More generally, each of the source and drain terminals of a FET may be referred to as a "current-conducting terminal," and that term could be used interchangeably for either a source terminal or a drain terminal.

According to an embodiment, during operation, the control signals provided to the series-coupled FETs in any particular switch 622, 625, 626, 631, 632, 635 are synchronous, in that they simultaneously cause all of the FETs in that switch either to be substantially conducting (e.g., "on" or "closed") or substantially non-conducting (e.g., "off" or "open"). To accomplish simultaneous control of all FETs in each switch, the gate terminals of the FETs in each switch may be electrically coupled to a single control node. For example, in FIGS. 7A and 7C, the gate terminals of FETs 701-703 are electrically coupled to control terminal 732, the gate terminals of FETs 704-706 are electrically coupled to control terminal 735, the gate terminals of FETs 707-709 are electrically coupled to control terminal 736, the gate terminals of FETs 710-718 are electrically coupled to control terminal 741, the gate terminals of FETs 719-727 are electrically coupled to control terminal 742, and the gate terminals of FETs 728-730 are electrically coupled to control terminal 745.

As indicated previously, a system that includes RF switch 700 may include a switch controller (e.g., switch controller 150, 250, FIGS. 1, 2) with multiple drivers (e.g., drivers 151, 152, 251, 252, FIGS. 1, 2), and each driver is coupled to one or more of the control terminals 732, 735, 736, 741, 742, 745 of the switches 622, 625, 626, 631, 632, 635. To cause an entire switch to become substantially conductive between the ports to which the switch is connected (e.g., to turn the switch "on" or to "close" the switch), the driver that is connected to the control node associated with that switch provides a control signal (or "drive signal") to the control node, and that control signal causes all of the FETs within the switch simultaneously to become substantially conducting. For example, a driver (e.g., driver 151, 251) coupled to control terminal 732 may provide a control signal to terminal 722, which simultaneously causes all of FETs 701-703 to become substantially conducting (e.g., to "turn on" or "close"), thus causing switch 622 to become substantially conductive between ports 628 and 648. Alternatively, the driver may provide a control signal to terminal 722, which simultaneously causes all of FETs 701-703 to become substantially non-conducting (e.g., to "turn off" or "open"), thus causing switch 622 to become substantially non-conductive between ports 628 and 648.

Further, according to an embodiment, in branches that include multiple, parallel-coupled switches/stacks (e.g., branches 624 and 630), the control signals provided to the FETs of the parallel-coupled switches of the branch also are synchronous, in that they simultaneously cause all of the FETs in that entire branch either to be substantially conducting (e.g., "on" or "closed") or substantially non-conducting (e.g., "off" or "open"). Although a single driver could provide control signals to all of the FETs of the parallel-coupled switches of a branch, separate drivers (e.g., drivers 151, 152, 251, 252, FIGS. 1, 2) may be used to drive each of the multiple switches in any given multi-switch branch. For example, in the branch between ports 638 and 648, a first driver (e.g., driver 151, 251, FIGS. 1, 2) may be coupled to control terminal 741, and that driver may provide a control signal to control terminal 741. A second driver (e.g., driver 152, 252, FIGS. 1, 2) may be coupled to control terminal 742, and that driver may provide a second control signal to control terminal 742. To turn switches 631 and 632 on or off synchronously, the control signals provided by the first and second driver are synchronous. Said another way, separate drivers are used to drive the parallel-coupled switches/stacks of any given branch synchronously, according to an embodiment.

As will now be explained, the above-described configuration of a branch that includes multiple-parallel coupled FET stacks (e.g., the branch between ports 638 and 648 or the branch between ports 628 and 652) may have improved settling time, in comparison to a conventional branch with a single FET stack that is designed to conduct signals with the same level of power. More specifically, during operation, an RF signal conveyed through a branch with multiple parallel-coupled FET stacks is divided between the parallel stacks. When the parallel-coupled FET stacks are substantially identical, each stack would convey approximately 50 percent of the total power of the RF signal. Accordingly, in comparison with a conventional switch branch that includes only a single stack designed to conduct a signal of the same power, the parallel-coupled FET stacks of the present embodiments need only to be designed to conduct signals of approximately half power in each stack. Thus, given the same signal power conveyed through a branch with parallel-coupled FET stacks and a conventional branch with a single stack, the FETs in the parallel-coupled FET stacks may be smaller in gate width/periphery. For example, a conventional RF switch may include a single FET stack between switch ports in which each FET has a 4 millimeter (mm) gate width, whereas each parallel-coupled FET stack may include FETs with only a 2 mm gate width.

Further, the parasitic capacitance on the gate of a FET is proportional to the gate width. Thus, the relatively small FETs associated with the various embodiments have shorter gate widths and thus lower gate capacitance, when compared with their larger counterparts in a conventional single-stack branch. Given that each of the parallel-coupled FET stacks also are separately driven (e.g., by separate drivers 151, 152, 251, 252, FIGS. 1, 2), in accordance with various embodiments, the time constants of the relatively small FETs in the parallel-coupled FET stacks also are smaller than the time constants of their larger conventional counterparts. This may result in a significantly faster (e.g., about 50 percent faster) settling time associated with switching between transmit and receive states, when using implementations of the various embodiments, when compared with the settling times for conventional RF switches.

In FIG. 7A, each of the switches 620, 625, 626, 631, 632, 635 is shown to include a stack of three series-coupled FETs 701-703, 704-706, 707-709, 710/711/718, 719/720/727, and 728-730. Although each of the switches 620, 625, 626, 631, 632, 635 may include a stack of three series-coupled FETs in some embodiments, each of the switches 620, 625, 626, 631, 632, 635 alternatively may include a single FET, two FETs, or more than three FETs (as indicated with the ellipses in each FET stack). In some embodiments, either or both of the shunt branches 624, 634 may not include any FETs, and instead port 628 and/or port 638 could be directly coupled to the corresponding voltage reference nodes 652, 653, respectively.

According to an embodiment, the parallel-coupled switches (or the parallel-coupled FET stacks) in a same branch are substantially identical (e.g., switches 631 and 632 are substantially identical), although switches in different branches may be different from each other (e.g., switches 631 and 625 may be different, although they may be substantially identical, as well). More specifically, within a same branch, each of the parallel-coupled switches may include the same number of series-coupled FETs, with the same total periphery and/or gate width. In other embodiments, the parallel-coupled switches (or the parallel-coupled FET stacks) in a same branch may be different from each other (e.g., they may have a different number of parallel-coupled FETs, and/or they may have different total peripheries and/or gate widths).

In addition to the FETs, each stack may include a DC bias distribution network of high-value (e.g., multiple kiloohm) resistors (e.g., resistors 791-793, FIG. 7A), in an embodiment, where each resistor is coupled between the source and drain terminals of a FET. The DC bias distribution network essentially ensures that the DC bias voltage provided to the drains/sources of each FET in the stack is the same. Although DC bias distribution networks are shown only in switches 622, 631, 632 in FIG. 7A, such networks also may be included in switches 625, 626, and 635.

Each stack also may include an RF blocking network of high-value (e.g., multiple kiloohm) resistors (e.g., resistors 794-796, FIG. 7A) coupled between the gate terminals of the FETs and the control terminal (e.g., control terminal 732, FIG. 7A) for the stack, in an embodiment. The RF blocking network presents a high impedance to RF signal energy to ensure that the RF signal energy conveyed through a branch does not leak to the control/driver circuitry (e.g., to controller 150, 250, FIGS. 1, 2).

Further still, each stack also may include body bias circuitry coupled between the body node of each FET, if included, and a body bias terminal (e.g., body bias terminal 786, FIG. 7A). The body bias circuitry also may include an RF blocking network of high-value (e.g., multiple kiloohm) resistors (e.g., resistors 797-799, FIG. 7A) coupled between the body nodes of the FETs and the body bias terminal for the stack, in an embodiment. Again, the RF blocking network presents a high impedance to RF signal energy to ensure that the RF signal energy conveyed through a branch does not leak to the body bias circuitry (not illustrated). Although body bias circuitry is shown only in switches 622, 631, 632 in FIG. 7A, such circuitry also may be included in switches 625, 626, and 635.

As described in conjunction with FIGS. 1 and 2, during operation of an embodiment of an RF switch (e.g., switches 110, 210, 500, 600, 700, FIGS. 1, 2, 5-7A), the state of the RF switch is controlled (e.g., through control signals sent by RF switch controller 150, 250, FIGS. 1, 2) based on whether the system (e.g., transceiver 100, 200, FIGS. 1, 2) is in a transmit mode or a receive mode (e.g., during a transmit time interval or a receive time interval, respectively, of a wireless communication session).

More specifically, when the system is in a transmit mode, the state of the RF switch is controlled to establish a low-impedance connection between port 148, 248, 548, 648 and port 128, 228, 528, 628, and to establish a high-impedance between port 148, 248, 548, 648 and port 138, 238, 538, 638. Further, in the transmit mode, the state of the RF switch is controlled (e.g., through control signals sent by RF switch controller 150, 250, FIGS. 1, 2) to establish a low-impedance connection between port 538, 638 and port 553, 653, and to establish a high-impedance between port 528, 628 and port 552, 652. In other words, in the transmit mode, switches 521, 522, 535, 536, 622, 635 are closed, and switches 525, 526, 531, 532, 631, 632 are open. Referring to FIG. 7A, this means that the RF switch controller sends control signals to control terminals 732 and 745 to cause FETs 701-703 and 728-730 to be in a substantially conducting state, and the RF switch controller sends control signals to control terminals 735, 736, 741, and 742 to cause FETs 704-709 and 710-727 to be in a substantially non-conducting state. Accordingly, in the transmit state, signal energy present at node 628 is conveyed through switch 622 (or branch 620) to node 648, and the conductive path between node 628 and voltage reference node 652 is open. In addition, in the transmit state, signal energy present at node 638 is conveyed through switch 635 (or branch 634) to voltage reference node 653, and the conductive path between node 638 and node 648 is open.

Conversely, when the system is in a receive mode, the state of the RF switch is controlled to establish a low-impedance connection between port 148, 248, 548, 648 and port 138, 238, 538, 638, and to establish a high-impedance between port 148, 248, 548, 648 and port 128, 228, 528, 628. Further, in the receive mode, the state of the RF switch is controlled to establish a low-impedance connection between port 528, 628 and port 552, 652, and to establish a high-impedance between port 538, 638 and port 553, 653. In other words, in the receive mode, switches 525, 526, 531, 532, 625, 626, 631, 632 are closed, and switches 521, 522, 535, 536, 622, 635 are open. Referring to FIG. 7A, this means that the RF switch controller sends control signals to control terminals 732 and 745 to cause FETs 701-703 and 728-730 to be in a substantially non-conducting state, and the RF switch controller sends control signals to control terminals 735, 736, 741, and 742 to cause FETs 704-709 and 710-727 to be in a substantially conducting state. Accordingly, in the receive state, signal energy present at node 638 is conveyed through switches 631 and 632 (or branch 630) to node 648, and the conductive path between node 638 and voltage reference node 653 is open. In addition, in the receive state, signal energy present at node 628 is conveyed through switches 625 and 626 (or branch 624) to voltage reference node 652, and the conductive path between node 628 and node 648 is open.

Figure 7B:
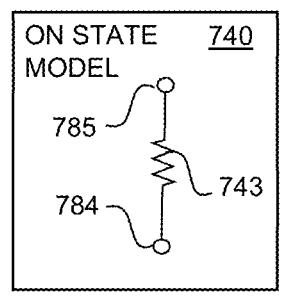
FIG. 7B illustrates "on-state" and "off-state" models for FETs in a stack.
Figure 7B:
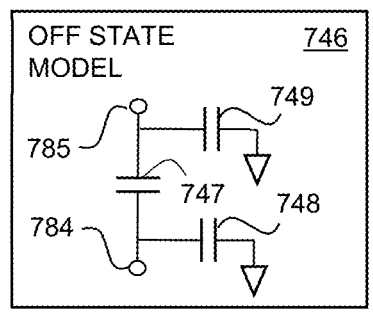

As indicated previously, to cause an entire stack to become substantially conductive between the ports to which the stack is connected (e.g., to turn the stack "on" or to "close" the switch), a switch driver provides a control signal (or "drive signal") to a stack control terminal, which causes all of the FETs within the stack simultaneously to become substantially conducting. This causes the stack to become substantially conductive between the ports to which the stack is coupled. In other words, referring to stack 620 as an example, when an appropriate control signal is provided to control terminal 732 to turn the stack "on", the FETs 701-703 and stack 620 are in the "on state". Referring to FIG. 7B, as shown in box 740, in the "on state", each FET 701-703 may be simply modeled as a resistor 743 with a first terminal corresponding to a drain terminal 784, and a second terminal corresponding to a source terminal 785. Alternatively, the driver may provide a control signal to stack control terminal 732, which simultaneously causes all of FETs 701-703 to become substantially non-conducting, thus causing the stack to become substantially non-conductive between the ports to which the stack is coupled. In other words, the FETs 701-703 and stack 620 are in the "off state". As shown in box 746 of FIG. 7B, in the "off state", each FET 701-703 may be simply modeled as a capacitor 747 ("Cds") with a first terminal corresponding to the drain terminal 784, and a second terminal corresponding to the source terminal 785, along with a first additional shunt capacitance 748 ("Csub1") between the source terminal and a ground reference, and a second additional shunt capacitance 749 ("Csub2") between the drain terminal and the ground reference. Csub1 748 and Csub2 749 represent the parasitic capacitance from the transistor body to the semiconductor substrate on which the FET is formed.

In the off state, the parasitic capacitances modeled by Csub1 748 and Csub2 749 each may facilitate an undesirable leakage current between the FET and the substrate, which ultimately results in RF signal loss. Further, these leakage currents may create an unequal or non-uniform RF voltage division across the stack. This non-uniform voltage distribution across the stack may lead to a lower power handling capability for the stack, because in the off state, the first and/or first few FETs in the stack may experience the stack breakdown voltage before the rest of the FETs in the off-state branch.

According to another embodiment, to balance the voltage distribution across a stack, and thus to increase the RF voltage handling capability of the stack, a stack also may include a network of "balancing" capacitors, in an embodiment. When parallel stacks are implemented (e.g., as in branches 624, 630, FIGS. 6, 7A, 7C), the balancing capacitor network may be implemented in each parallel stack.

Figure 7C:
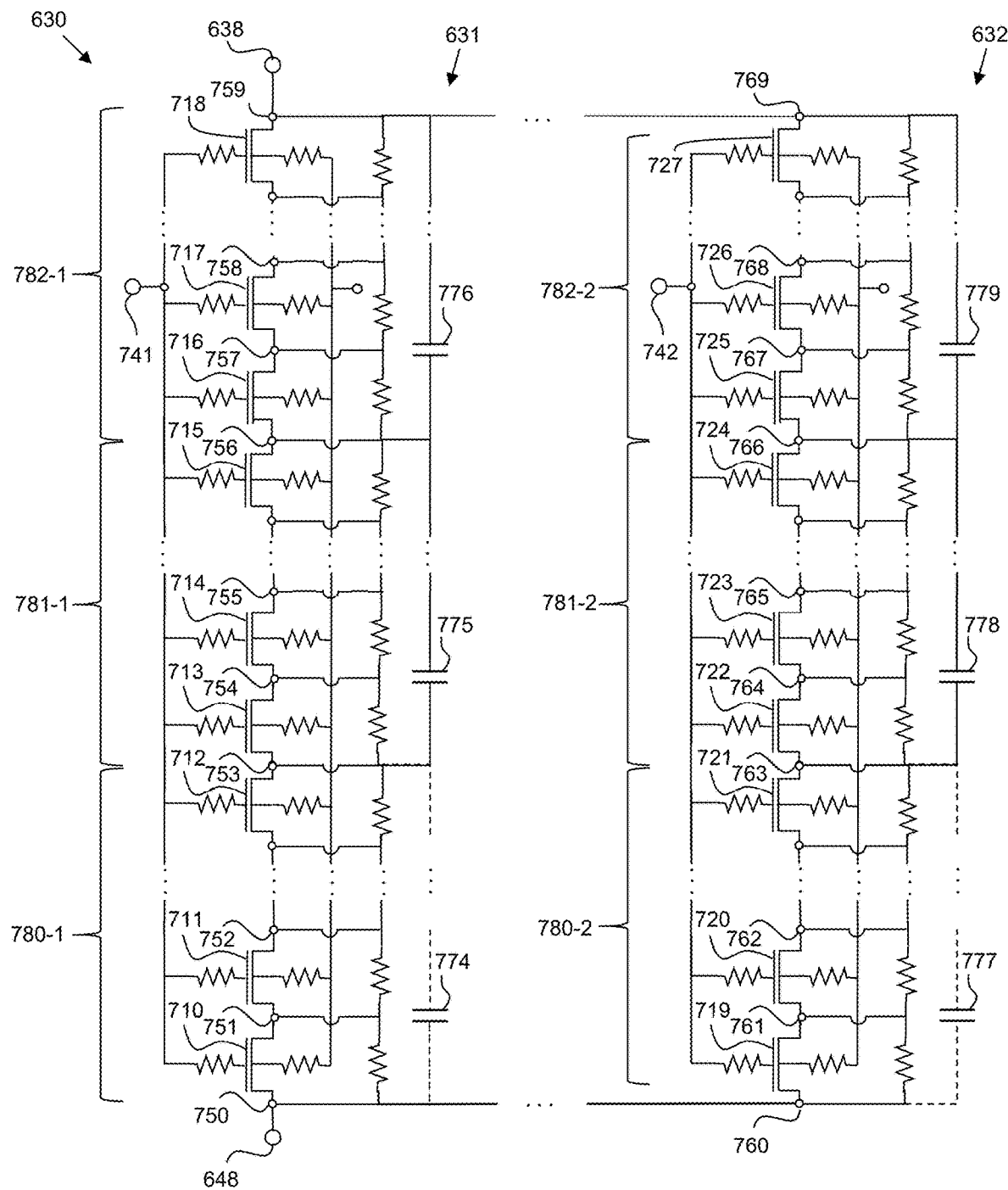
FIG. 7C is a detailed circuit diagram of an alternate embodiment of a switch branch that may be used for any or all of the switch branches in FIG. 5, 6 or 7A, in accordance with an alternate embodiment.

To illustrate this concept in a generic way, reference is made to FIG. 7C, which is a simplified circuit diagram of another embodiment of branch 630 (e.g., branch 630, FIGS. 6, 7A), in which parallel stacks 631, 632 of FETs 710-727 are implemented. It should be understood that implementation of a balancing capacitor network in branch 630 is for example purposes, and in other embodiments, balancing capacitor network(s) may alternatively or also be implemented in any or all of branches 620, 624, and/or 634.

In FIG. 7C, each FET 710-727 includes gate, drain, source, and (optionally) body bias terminals (e.g., terminals 783-785, FIG. 7A), and the on and off states of the FETs 710-727 may be modeled as depicted in boxes 740, 746 (FIG. 7B), respectively. Further, each FET 710-727 may be a single-gate FET or a multiple-gate FET.

In FIG. 7C, the FETs 710-727 of each stack 631, 632 of branch 630 are divided into groups 780-1, 780-2, 781-1, 781-2, 782-1, 782-2, of FETs, where each group includes three or more (as indicated by the ellipses) adjacent, series-coupled FETs. Selection of three FETs per group is for example purposes, and each group may include fewer or more FETs. In various embodiments, each group 780-1, 780-2, 781-1, 781-2, 782-1, 782-2 may include from two to 10 adjacent FETs, for example, and the number of FETs in each group 780-1, 780-2, 781-1, 781-2, 782-1, 782-2 may be the same or different (e.g., group 781-1 may include fewer or more FETs than group 782-1, and so on). Although each stack 631, 632 is shown to include three groups 780-1, 780-2, 781-1, 781-2, 782-1, 782-2 of FETs, each stack 631, 632 may include as few as two groups, or more than three groups, in other embodiments. According to an embodiment, however, stacks 631 and 632 are identical (e.g., including identical numbers of FETs, identical balancing capacitor networks, etc.).

In the series-coupled sequence of FETs corresponding to stack 631, the drain terminal of FET 710 may be coupled through current-conducting node 750 to port 648, the source terminal of FET 710 may be coupled through current-conducting node 751 to the drain terminal of FET 711, the source terminal of FET 711 may be coupled through current-conducting node 752 (and through zero or more additional FETs, not illustrated) to the drain terminal of FET 712, the source terminal of FET 712 may be coupled through current-conducting node 753 (and through zero or more additional FETs, not illustrated) to the drain terminal of FET 713, and so on, with the source terminal of FET 718 being coupled through current-conducting node 759 to port 638.

Similarly, in the series-coupled sequence of FETs corresponding to stack 632, the drain terminal of FET 719 may be coupled through current-conducting node 760 to port 648, the source terminal of FET 719 may be coupled through current-conducting node 761 to the drain terminal of FET 720, the source terminal of FET 720 may be coupled through current-conducting node 762 (and through zero or more additional FETs, not illustrated) to the drain terminal of FET 721, the source terminal of FET 721 may be coupled through current-conducting node 763 (and through zero or more additional FETs, not illustrated) to the drain terminal of FET 722, and so on, with the source terminal of FET 727 being coupled through current-conducting node 769 to port 638.

As discussed previously, simultaneous control of all FETs 710-718, 719-727 in each stack 631, 632 is accomplished by electrically coupling the gate terminals of the FETs 710-718, 719-727 in each stack 631, 632 to a stack control terminal 741, 742. To cause each entire stack 631, 632 to become substantially conductive between ports 648, 638 (e.g., to turn each stack "on" or to "close" each switch), two drivers (e.g., of switch controller 150, 250, FIGS. 1, 2) provide drive signals to the stack control terminals 741, 742. Each control signal causes all of the FETs 710-718, 719-727 within each stack 631, 632 simultaneously to become substantially conducting, thus causing each stack 631, 632 to become substantially conductive between ports 648 and 638.

In addition, as discussed in conjunction with FIG. 7A, each stack 631, 632 may include a DC bias distribution network of high-value (e.g., multiple kiloohm) resistors (e.g., including resistors 791-793, FIG. 7A), in an embodiment, where each resistor is coupled between the source and drain terminals of a FET 710-727. Further, as also discussed in conjunction with FIG. 7A, each stack 631, 632 also may include an RF blocking network of high-value (e.g., multiple kiloohm) resistors (e.g., including resistors 794-796, FIG. 7A) coupled between the gate terminals of the FETs 710-727 and the stack control terminals 741, 742, in an embodiment. Further still, each stack 631, 632 also may include body bias circuitry coupled between the body node of each FET, if included, and a body bias terminal (e.g., body bias terminal 790, FIG. 7A). The body bias circuitry also may include an RF blocking network of high-value (e.g., multiple kiloohm) resistors (e.g., resistors 797-799, FIG. 7A) coupled between the body nodes of the FETs and the body bias terminal for each stack 631, 632, in an embodiment.

To balance the voltage distribution across each stack 631, 632, and thus to increase the RF voltage handling capability of each stack 631, 632, each stack 631, 632 also includes a network of balancing capacitors 774-776, 777-779, in an embodiment. According to an embodiment, the balancing capacitors 774-776, 777-779 are coupled to some (but not all) of the current-conducting nodes 750-769 of each stack 631, 632, meaning that each balancing capacitor is connected across a different group of multiple adjacent FETs 710-727 in each stack 631, 632. In the embodiment of FIG. 7C, for example, each balancing capacitor 774-779 is connected across a different group of three or more adjacent FETs in the series-coupled arrangement of FETs 710-727 in each stack 631, 632.

More specifically, in stack 631, a first balancing capacitor 774 is coupled across a first group 780-1 of three or more FETs 710-712, where a first terminal of capacitor 774 is coupled to current-conducting node 750 (and thus to the drain of FET 710), and a second terminal of capacitor 774 is coupled to current-conducting node 753 (and thus to the source of FET 712 and the drain of FET 713). Node 750 may be considered to be an "input" of the first group of FETs 710-712, and node 753 may be considered to be an "output" of the first group of FETs 710-712. A second balancing capacitor 775 is coupled across a second group 781-1 of three or more FETs 713-715, where a first terminal of capacitor 775 is coupled to current-conducting node 753 (and thus to the source of FET 712 and the drain of FET 713), and a second terminal of capacitor 775 is coupled to current-conducting node 756 (and thus to the source of FET 715 and the drain of FET 716). Node 753 may be considered to be an "input" of the second group of FETs 712-714, and node 756 may be considered to be an "output" of the second group of FETs 712-714. Finally, a third balancing capacitor 776 is coupled across a third group 782-1 of three or more FETs 715-718, where a first terminal of capacitor 776 is coupled to current-conducting node 756 (and thus to the source of FET 715 and the drain of FET 716), and a second terminal of capacitor 776 is coupled to current-conducting node 759 (and thus to the source of FET 718 and terminal 638). Node 756 may be considered to be an "input" of the third group of FETs 716-718, and node 759 may be considered to be an "output" of the third group of FETs 716-718.

Similarly, in stack 633, a first balancing capacitor 777 is coupled across a first group 780-2 of three or more FETs 719-721, where a first terminal of capacitor 777 is coupled to current-conducting node 760 (and thus to the drain of FET 719), and a second terminal of capacitor 777 is coupled to current-conducting node 763 (and thus to the source of FET 721 and the drain of FET 722). Node 760 may be considered to be an "input" of the first group of FETs 719-721, and node 763 may be considered to be an "output" of the first group of FETs 719-721. A second balancing capacitor 778 is coupled across a second group 781-2 of three or more FETs 722-724, where a first terminal of capacitor 778 is coupled to current-conducting node 763 (and thus to the source of FET 721 and the drain of FET 722), and a second terminal of capacitor 778 is coupled to current-conducting node 766 (and thus to the source of FET 724 and the drain of FET 725). Node 763 may be considered to be an "input" of the second group of FETs 722-724, and node 766 may be considered to be an "output" of the second group of FETs 722-724. Finally, a third balancing capacitor 779 is coupled across a third group 782-2 of three or more FETs 725-727, where a first terminal of capacitor 779 is coupled to current-conducting node 766 (and thus to the source of FET 724 and the drain of FET 725), and a second terminal of capacitor 779 is coupled to current-conducting node 769 (and thus to the source of FET 727 and terminal 638). Node 766 may be considered to be an "input" of the third group of FETs 725-727, and node 769 may be considered to be an "output" of the third group of FETs 725-727.

It should be noted that current-conducting nodes that are in-between the FETs in any given group (e.g., current-conducting nodes 751, 752, 754, 755, 757, 758, 761, 762, 764, 765, 767, 768) are not directly connected to the networks of balancing capacitors 774-779. In addition, although FIG. 7C depicts three groups 780-1, 780-2, 781-1, 781-2, 782-1, 782-2 of FETs in each stack 631, 632, each stack 631, 632 may have as few as two groups or more than three groups, in other embodiments. According to an embodiment, each of the balancing capacitors 774-779 has a capacitance value in a range of about 50 femto-Farads (fF) to about 500 fF, although the capacitance values may be lower or higher, as well.

In some embodiments, balancing capacitors 774-776 and 777-779 are connected across all of the groups of FETs 710-718 and 719-727 in the stacks 631, 632. In other embodiments, balancing capacitors may be connected across some, but not all, FETs in a stack. For example, as indicated with the dashed-line connections between balancing capacitors 774, 777 and nodes 750/753, 760/763, each of balancing capacitors 774, 777 may be omitted. In other embodiments, one or more other or additional balancing capacitors may be omitted (e.g., balancing capacitors 775/778 and/or 776/779 also or alternatively may be omitted).

Figure 8:
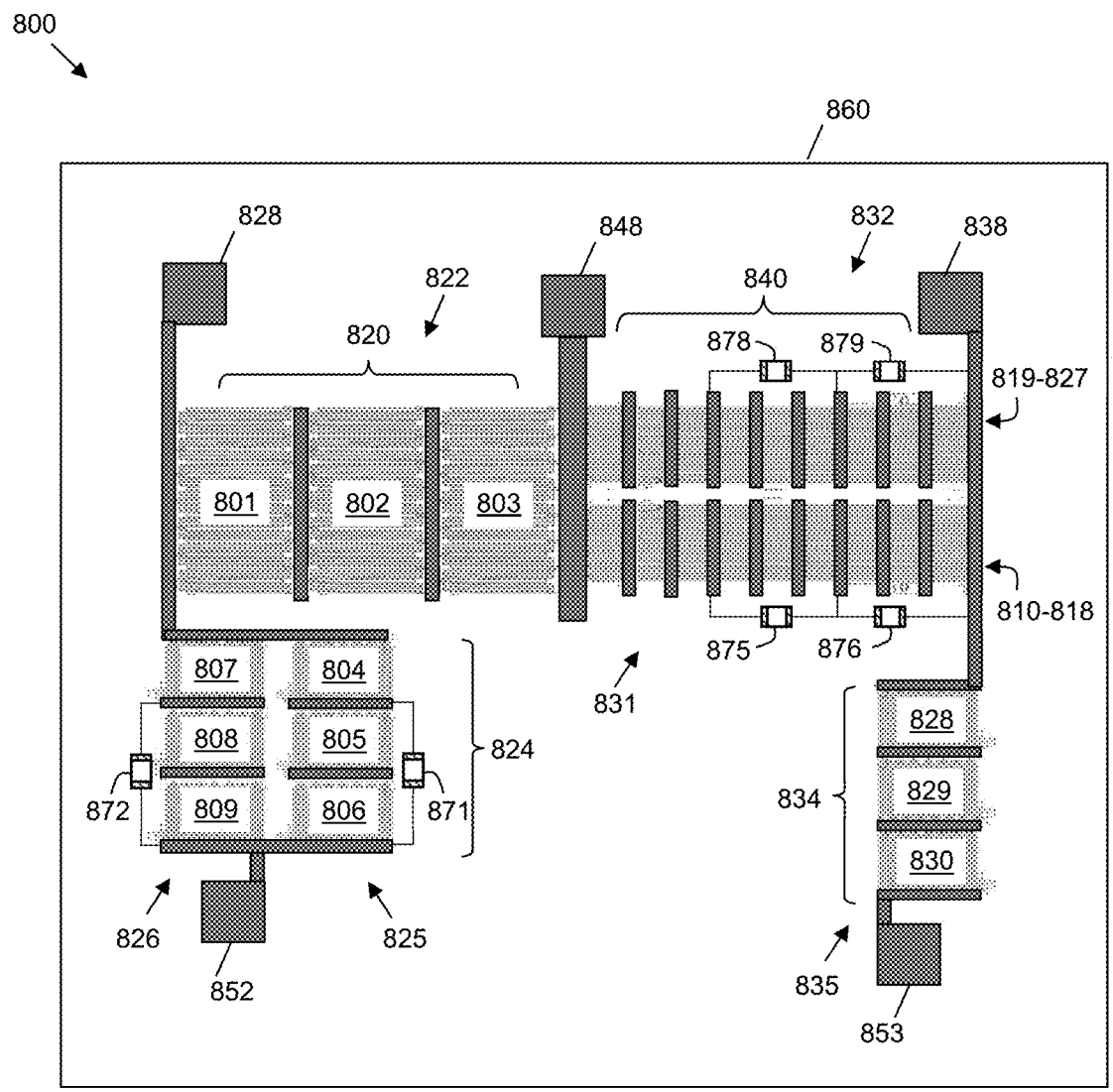
FIG. 8 is a top view of a monolithic RF switch integrated circuit (IC) that includes an embodiment of the RF switch branch of FIG. 7C, in accordance with an embodiment.

An embodiment of an RF switch integrated circuit (IC) that embodies the circuitry of FIG. 7C will now be described. More particularly, FIG. 8 is a top view of a monolithic RF switch IC 800 that includes the combination of FET stacks of FIGS. 6 and 7, in accordance with an embodiment. RF switch IC 800 includes a plurality of branches 820, 824, 840, 834 (e.g., branches 620, 624, 630, 634, 720, 724, 730, 734, FIGS. 6, 7A, 7C). Each branch includes one or two switches/FET stacks 822, 825, 826, 831, 832, 835 (e.g., switches 622, 625, 626, 631, 632, 635, FIGS. 6, 7A, 7C), and each FET stack includes multiple, series-coupled FETs 801-803, 804-806, 807-809, 810-818, 819-827, 828-830 (e.g., FETs 701-703, 704-706, 707-709, 710-718, 719-727, 728-730, FIG. 7A, 7C). According to an embodiment, the branches 820, 824, 840, 834 may form portions of a single, monolithic semiconductor chip (i.e., a single semiconductor substrate). Alternatively, some or all of the branches 820, 824, 840, 834 may be included within distinct semiconductor chips that are electrically connected together using wirebonds and/or other electrically conductive structures.

According to on embodiment, the RF switch IC 800 is "monolithic," in that the FETs 801-830 are formed in and on a single integrated circuit substrate 860. For example, according to an embodiment, the RF switch IC 800 may be formed on a gallium arsenide (GaAs)-based substrate 860, although those of skill in the art would understand, based on the description herein, that the circuitry of the RF switch may be formed on other types of substrates, as well, including silicon (Si)-based substrates (e.g., bulk Si CMOS, silicon-on insulator (SoI) CMOS, and so on) and gallium nitride (GaN)-based substrates (e.g., GaN on silicon, GaN on silicon carbide (SiC), and so on). Further, the FETs may include metal oxide semiconductor FETs (MOSFETs), high electron mobility transistors (HEMTs), metal-semiconductor field effect transistors (MESFETs), laterally diffused metal-oxide semiconductor (LDMOS) FETs, Enhancement-mode MOSFETs (EMOSFETs), and/or junction gate FETs (JFETs), to name a few.

In addition to branches 820, 824, 840, 834, RF switch IC 800 includes a plurality of I/O, control, and voltage reference nodes 828, 838, 848, 852, 853, each of which may provide for electrical connectivity with external circuitry (e.g., connectivity with antenna 140, transmitter 120, receiver 130, 230, circulator 216, RF switch controller 150, 250, and so on) and/or electrical connectivity with one or more power sources and/or voltage references (e.g., power, ground and other voltage references). For example, some or all of the I/O, control, and voltage reference nodes 828, 838, 848, 852, 853 may be implemented as conductive pads that are exposed at a top surface of the RF switch IC 800. Accordingly, the various nodes 828, 838, 848, 852, 853 may serve as bond pads for wirebonds (e.g., wirebonds 370, FIG. 3), which provide for electrical connectivity to the above-mentioned external circuitry or to other circuitry. According to an embodiment, the various nodes include a first node 828 (e.g., node 128, 228, 528, 628, FIGS. 1, 2, 5, 6, 7A), a second node 838 (e.g., node 138, 238, 538, 638, FIGS. 1, 2, 5, 6, 7A, 7C), a third node 848 (e.g., node 148, 248, 548, 648, FIGS. 1, 2, 5, 6, 7A, 7C), and voltage reference nodes 852, 853 (e.g., reference nodes 552, 553, 652, 653, FIGS. 5, 6, 7A).

For each FET 801-830, the electrical conductivity of the FET channel between the source and drain terminals is controlled by control signals provided to each gate structure through a gate terminal (e.g., terminal 783, FIG. 7A). To enable such channel conductivity control, RF switch IC 800 also includes a plurality of control nodes (not illustrated in FIG. 8, but corresponding to control terminals 732, 735, 736, 741, 742, 745, FIGS. 7A, 7C) that enable control signals to be provided by external circuitry to the gate terminals of the FETs 801-830. According to an embodiment, the control signals provided to the FETs in any particular branch 820, 824, 840, 834 are synchronous, in that they simultaneously cause all of the FETs in that branch either to be substantially conducting (e.g., "on" or "closed") or substantially non-conducting (e.g., "off" or "open").

A first branch 820, consisting of a first stack 822 of series-coupled FETs 801, 802, 803 (e.g., FETs 701-703, FIG. 7A), is electrically coupled between node 828 and node 848. More specifically, a drain terminal of FET 801 is electrically coupled to node 828, a source terminal of FET 801 is electrically coupled to a drain terminal of FET 802, a source terminal of FET 802 is electrically coupled to a drain terminal of FET 803, and a source terminal of FET 803 is electrically coupled to node 848, in an embodiment. Although not shown in FIG. 8, one or more balancing capacitors may be coupled between FETs 801-803, in an alternate embodiment.

A second branch 824, consisting of two parallel-coupled FET stacks 825, 826 (e.g., including FETs 704-709, FIG. 7A), is electrically coupled between node 828 and voltage reference node 852. More specifically, in stack 825, a drain terminal of FET 804 is electrically coupled to node 828, a source terminal of FET 804 is electrically coupled to a drain terminal of FET 805, a source terminal of FET 805 is electrically coupled to a drain terminal of FET 806, and a source terminal of FET 806 is electrically coupled to voltage reference node 852. In addition, according to an embodiment, a balancing capacitor 871 has a first terminal coupled to the drain of FET 805, and a second terminal coupled to the source of FET 806. As discussed above, the balancing capacitor 871 functions to balance RF voltages across the FETs 804-806 when the stack 825 is in an off state.

In stack 826, a drain terminal of FET 807 is electrically coupled to node 828, a source terminal of FET 807 is electrically coupled to a drain terminal of FET 808, a source terminal of FET 808 is electrically coupled to a drain terminal of FET 809, and a source terminal of FET 809 is electrically coupled to voltage reference node 852. In addition, according to an embodiment, a balancing capacitor 872 has a first terminal coupled to the drain of FET 808, and a second terminal coupled to the source of FET 809. As discussed above, the balancing capacitor 872 functions to balance RF voltages across the FETs 807-809 when the stack 826 is in an off state.

A third branch 840, consisting of two parallel-coupled FET stacks 831, 832 (e.g., including FETs 710-727, FIGS. 7A, 7C), is electrically coupled between node 848 and node 838. More specifically, in stack 831, a drain terminal of FET 810 is electrically coupled to node 848, a source terminal of FET 810 is electrically coupled to a drain terminal of FET 811, a source terminal of FET 811 is electrically coupled to a drain terminal of FET 812, and so on through FETs 812-818, until a source terminal of FET 818 is electrically coupled to node 838. In addition, according to an embodiment, stack 831 also includes a network of balancing capacitors 875, 876, which includes a first balancing capacitor 875 with a first terminal coupled to the drain of FET 813, and a second terminal coupled to the source of FET 815, and a second balancing capacitor 876 with a first terminal coupled to the drain of FET 816, and a second terminal coupled to the source of FET 818. Although not shown in FIG. 8, a balancing capacitor also or alternatively may be coupled between FETs 810-812, in an alternate embodiment. As discussed above, the network of balancing capacitors 875, 876 functions to balance RF voltages across the FETs 810-818 when the stack 831 is in an off state.

In stack 832, a drain terminal of FET 819 is electrically coupled to node 848, a source terminal of FET 819 is electrically coupled to a drain terminal of FET 820, a source terminal of FET 820 is electrically coupled to a drain terminal of FET 821, and so on through FETs 821-827, until a source terminal of FET 827 is electrically coupled to node 838. In addition, according to an embodiment, stack 832 also includes a network of balancing capacitors 878, 879, which includes a first balancing capacitor 878 with a first terminal coupled to the drain of FET 822, and a second terminal coupled to the source of FET 824, and a second balancing capacitor 879 with a first terminal coupled to the drain of FET 825, and a second terminal coupled to the source of FET 827. Although not shown in FIG. 8, a balancing capacitor also or alternatively may be coupled between FETs 819-821, in an alternate embodiment. As discussed above, the network of balancing capacitors 878, 879 functions to balance RF voltages across the FETs 819-827 when the stack 832 is in an off state.

Finally, a fourth branch 834, consisting of a sixth stack 835 of series-coupled FETs 828, 829, 830 (e.g., FETs 728-730, FIG. 7A), is electrically coupled between node 838 and voltage reference node 853. More specifically, a drain terminal of FET 828 is electrically coupled to node 838, a source terminal of FET 828 is electrically coupled to a drain terminal of FET 829, a source terminal of FET 829 is electrically coupled to a drain terminal of FET 830, and a source terminal of FET 830 is electrically coupled to voltage reference node 853, in an embodiment. Although not shown in FIG. 8, one or more balancing capacitors may be coupled between FETs 828-830, in an alternate embodiment. When incorporated into a larger electrical system (e.g., transceiver 100, 200, FIGS. 1, 2), voltage reference nodes 852, 853 typically would be coupled to a ground reference (e.g., zero volts), although nodes 852, 853 alternatively could be coupled to a positive or negative DC voltage reference, as well.

A comparison of the FETs 801-803 in branch 820 to the FETs 810-827 in branch 840 illustrates that, to conduct signals of substantially the same maximum power, a conventional switch branch that includes only a single stack (e.g., stack 822 in branch 820) would include significantly larger FETs (e.g., FETs 801-803) than the FETs (e.g., FETs 810-827) in an embodiment of a switch branch that includes multiple stacks (e.g., stacks 831, 832 in branch 840). In other words, given the same signal power conveyed through a branch with parallel-coupled FET stacks (e.g., branch 840) and a conventional branch with a single stack (e.g., branch 820), the FETs in the parallel-coupled FET stacks (e.g., FETs 810-827) may be smaller in gate width/periphery than the FETs in the conventional FET stack (e.g., FETs 801-803). Because the relatively small FETs have lower gate capacitance, when compared with their larger counterparts, the time constants of the relatively small FETs also are smaller than the time constants of their larger counterparts. Accordingly, the settling time for the parallel-coupled FET stacks may be significantly faster than the settling time for the conventional single FET stack.

Figure 9:
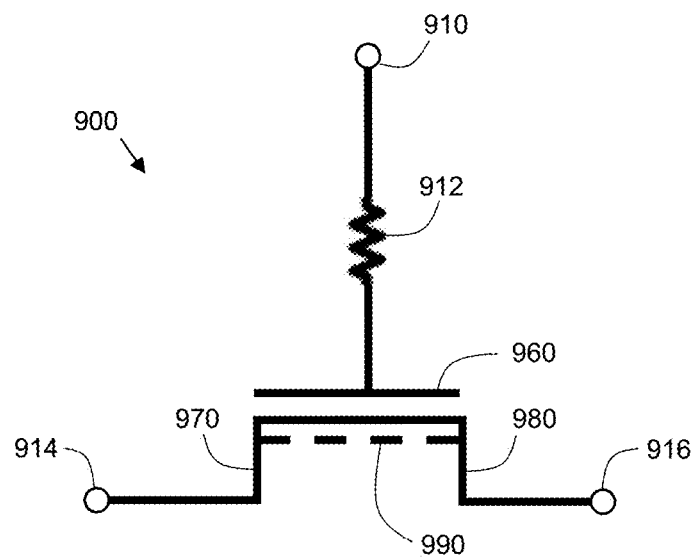
FIG. 9 is a simplified circuit diagram of a single-gate FET and associated circuitry, in accordance with an embodiment.

As previously mentioned, the various FETs in the above-described embodiments of RF switches may include single-gate FETs and/or multiple-gate FETs. For example, FIG. 9 is a simplified circuit depiction of a single-gate FET 900 that may be used for some or all of the FETs (e.g., FETs 701-730, 801-830, FIGS. 7A, 7C, 8) in an RF switch, in accordance with an embodiment. The single-gate FET 900 has a source terminal 970 (e.g., source terminal 785, FIG. 7A), a drain terminal 980 (e.g., drain terminal 784, FIG. 7A), and a gate 960 (e.g., gate terminal 783, FIG. 7A). The gate 960 overlies a FET channel (depicted with dashed line 990) that extends between the source terminal 970 and the drain terminal 980. Although not shown in FIG. 9, a body bias terminal may be connected to the FET 900 to enable a body bias voltage to be supplied to the FET 900 from an external voltage source.

The gate 960 is electrically coupled to a control terminal 910 (e.g., terminal 783, FIG. 7A) through a resistance 912. The source terminal 970 is electrically coupled to a first node 914 (e.g., directly or indirectly coupled to any of nodes 750-769, FIG. 7C, or to the drain terminal of another FET), and the drain terminal 980 is electrically coupled to a second node 916 (e.g., directly or indirectly coupled to any of nodes 750-759, FIG. 7C or to the source terminal of another FET).

Figure 10:
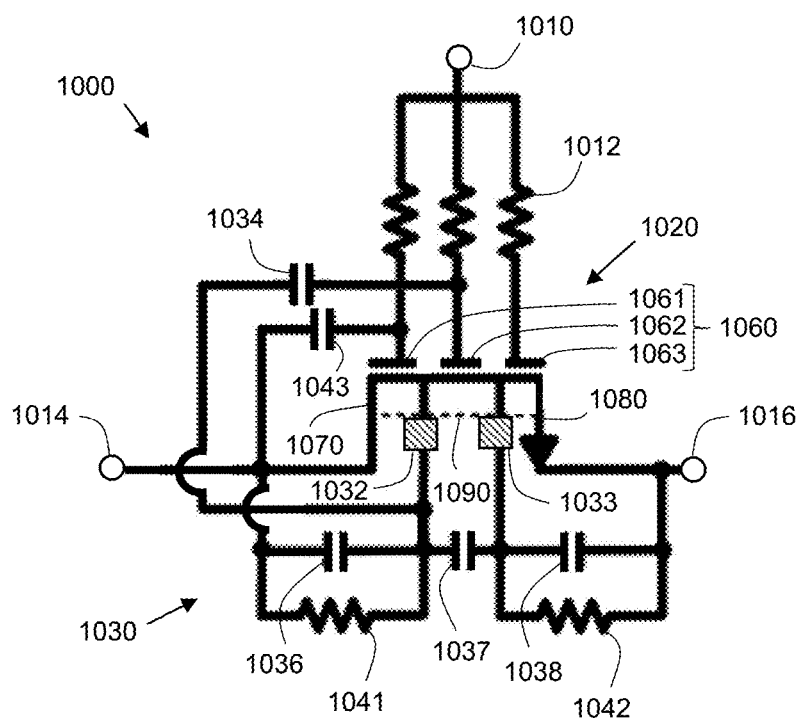
FIG. 10 is a simplified circuit diagram of a multiple-gate FET and associated circuitry, in accordance with another embodiment.

In other embodiments, some or all of the various FETs in the above-described embodiments of RF switches may include multiple-gate FETs and/or multiple-gate FET assemblies. For example, FIG. 10 is a simplified circuit diagram of a multiple-gate FET assembly 1000 that may be used in place of some or all of the FETs (e.g., FETs 701-730, 801-830, FIGS. 7A, 7C, 8) in an RF switch, in accordance with another embodiment. The multiple-gate FET assembly 1000 includes a multiple-gate FET 1020 and a voltage leveling circuit 1030. According to an embodiment, the multiple-gate FET assembly 1000 is monolithically and integrally formed in and on a semiconductor substrate.

Multiple-gate FET 1020 includes a source terminal 1070 (e.g., source terminal 785, FIG. 7A), a drain terminal 1080 (e.g., drain terminal 784, FIG. 7A), a multiple-gate FET channel (depicted with dashed line 1090) between the source and drain terminals 1070, 1080, and a multiple-gate assembly 1060 (e.g., analogous to gate terminal 783, FIG. 7A) with a plurality of gate structures 1061, 1062, 1063 over the multiple-gate FET channel 1090. The term "multiple-gate FET channel," as used herein, refers to an entire variable-conductivity path between the source and drain terminals of a multiple-gate FET (e.g., between source and drain terminals 1070, 1080). As mentioned previously, utilization of multiple gates may enable better electrical control over the channel 1090, when compared with single-gate FETs. This, in turn, may enable more effective suppression of "off-state" leakage current, and/or enhanced current in the "on" state (i.e., drive current). Although not shown in FIG. 10, a body bias terminal may be connected to the FET 1020 to enable a body bias voltage to be supplied to the FET 1020 from an external voltage source.

The multiple-gate assembly 1060 is electrically coupled to a control terminal 1010 (e.g., terminal 783, FIG. 7A) through a plurality of resistances 1012. The source terminal 1070 is electrically coupled to a first node 1014 (e.g., directly or indirectly coupled to any of nodes 750-759, FIG. 7C, or to the drain terminal of another FET), and the drain terminal 1080 is electrically coupled to a second node 1016 (e.g., directly or indirectly coupled to any of nodes 750-759, FIG. 7C or to the source terminal of another FET).

The voltage leveling circuit 1030 is electrically connected between the source terminal 1070, the drain terminal 1080, and the multiple-gate assembly 1060. Circuit 1030 includes a plurality of channel contacts 1032, 1033, a plurality of capacitors 1034, 1036, 1037, 1038, 1043, and a plurality of resistors 1041, 1042, according to an embodiment. Each of the channel contacts 1032, 1033 may be, for example, an ohmic contact that is electrically coupled to the active surface of the semiconductor substrate over the multiple-gate FET channel 1080 between first and second pairs of adjacent gate structures 1061-1063.

Through various electrical connections, the channel contacts 1032, 1033 are electrically coupled to capacitors 1034, 1036-1038, 1043, and capacitors 1034, 1036-1038, 1043 are electrically coupled to the multiple-gate assembly 1060, and to the source and drain terminals 1070, 1080, as shown in FIG. 10. Each of the capacitors 1034, 1036-1038, 1043 may be a metal-insulator-metal (MIM) capacitor that is integrally formed with the substrate (e.g., a first electrode formed from a portion of a first metal layer, a second electrode formed from a portion of a second metal layer, and an insulating layer (e.g., silicon nitride or other suitable insulating materials) sandwiched between the first and second electrodes). In other embodiments, some or all of capacitors 1034, 1036-1038, 1043 may be discrete capacitors that are electrically coupled to the top surface of the semiconductor substrate.

When implemented in a system with a stack of multiple-gate FETs, the voltage leveling circuit 1030 may result in a more uniform, off-state AC voltage distribution across the FETs of the stack. More specifically, by utilizing equalizing capacitors 1036-1038 connected as shown in FIG. 10, AC voltage swing may be substantially equalized across all FETs in an off-state FET branch of an RF switch (or across multiple-gate FETs in a different type of circuit), thereby potentially preventing the first and/or first few multiple-gate FETs from experiencing the stack breakdown voltage before the rest of the multiple-gate FETs in the off-state branch. This may significantly improve the power handling capability of the switch branch.

Circuit 1030 also includes relatively high-value resistors 1041, 1042, which are electrically connected in parallel with capacitors 1036 and 1038, respectively, in an embodiment. Resistors 1041, 1042 may be integrally formed with the semiconductor substrate (e.g., stripline resistors, polysilicon resistors, and so on), or may be discrete resistors that are coupled to the top surface of the substrate, in various embodiments. The resistors 1041, 1042 of the voltage leveling circuit 1030 may result in a more uniform, off-state DC voltage distribution across the FETs of a stack. More specifically, the relatively high-value resistors 1041, 1042 act as conductors for the DC signal, which is blocked by the capacitances, both intentional and parasitic, while most of the RF signal passes primarily through the capacitances. This balance is achieved by selecting appropriately valued resistors and capacitors in the parallel resistor/capacitor combinations.

Figure 11:
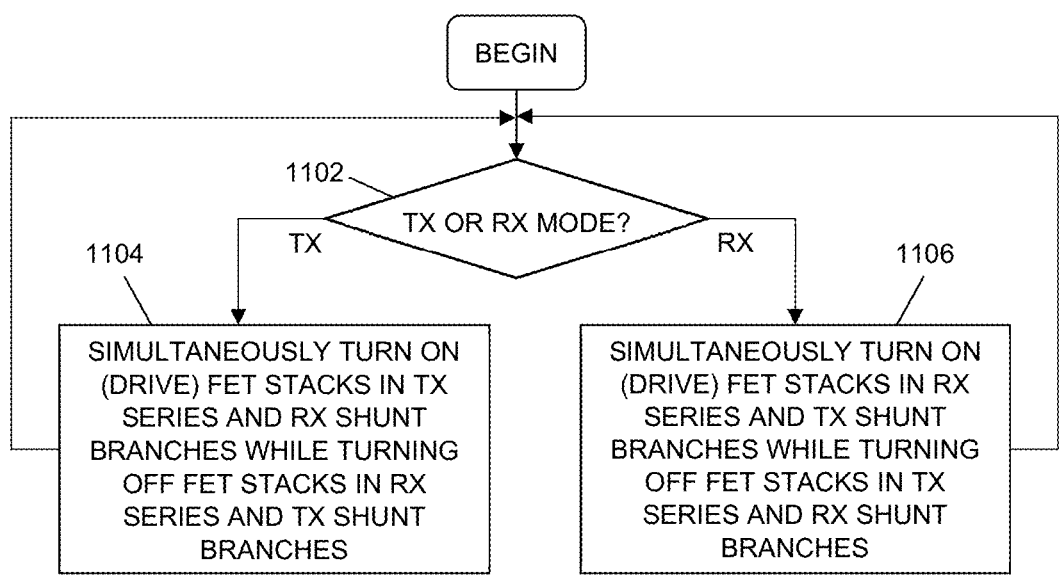
FIG. 11 is a flowchart of a method of operating an RF switch in an RF transceiver, in accordance with an embodiment.

FIG. 11 is a flowchart of a method of operating an RF switch (e.g., RF switch 110, 210, 310, 410, 500, 600, 700, 800, FIGS. 1-8) in an RF transceiver (e.g., transceiver 100, 200, FIGS. 1, 2), in accordance with an embodiment. The method may begin, in block 1102, when a determination is made (e.g., by RF switch controller 150, 250, FIGS. 1, 2) whether the RF transceiver should be configured in a transmit (TX) mode or a receive (RX) mode. For example, this determination may be made based on a TX/RX control signal from a higher-level communication controller.

When the transceiver is to be configured in a transmit mode configuration, then in block 1104, the FET stacks in the TX series and RX shunt branches (e.g., branches 520, 534, 620, 634, FIGS. 5, 6, 7A) simultaneously are turned on, while the FET stacks in the RX series and the TX shunt branches (e.g., branches 530, 524, 630, 624, FIGS. 5, 6, 7A, 7C) simultaneously are turned off. To achieve this, the drivers (e.g., drivers 151, 152, 251, 252, FIGS. 1, 2) of the RF switch controller provide control signals to the control nodes (e.g., terminals 732, 735, 736, 741, 742, 745, FIGS. 7A, 7C) of the various FET stacks of the RF switch to configure the RF switch in the transmit mode configuration. For example, to configure the RF switch 700 of FIG. 7A into the transmit mode configuration, one or more drivers of the RF switch controller may send first control signals to control terminals 732 and 745 to simultaneously turn on branches 620 and 634 (i.e., to close switches 622, 635 to establish low-impedance paths between nodes 628 and 648, and between nodes 638 and 653). At the same time, one or more drivers of the RF switch controller may send second control signals to control nodes 735, 736, 741, 742 to simultaneously turn off branches 624 and 630 (i.e., to open switches 625, 626, 631, 632 to establish high-impedance conditions between nodes 628 and 652 and between nodes 638 and 648). Upon turning off branches 624 and 630, the balancing capacitors (e.g., balancing capacitors 774-779, 871, 872, 875, 876, 878, 879, FIGS. 7C, 8), if included in branches 624 and/or 630, function to balance RF voltages across the FETs of the associated branch stack(s). The RF switch controller continues to send these control signals to the various control nodes until a determination is made (in block 1102) that the transceiver is to be configured in a receive mode.

When the transceiver is to be configured in a receive mode configuration, then in block 1106, the FET stacks in the RX series and TX shunt branches (e.g., branches 530, 534, 630, 624, FIGS. 5, 6, 7A, 7C) simultaneously are turned on, while the FET stacks in the TX series and the RX shunt branches (e.g., branches 520, 534, 620, 634, FIGS. 5, 6, 7A) simultaneously are turned off. To achieve this, the drivers (e.g., drivers 151, 152, 251, 252, FIGS. 1, 2) of the RF switch controller provide control signals to the control nodes (e.g., terminals 732, 735, 736, 741, 742, 745, FIGS. 7A, 7C) of the various FET stacks of the RF switch to configure the RF switch in the receive mode configuration. For example, to configure the RF switch 700 of FIG. 7A into the receive mode configuration, distinct drivers of the RF switch controller (e.g., drivers 151 and 152, or drivers 251 and 252) may simultaneously send first and second control signals, respectively, to control nodes 735, 736, 741, 742 to simultaneously turn on branches 624 and 630 (i.e., to close switches 625, 626, 631, 632 to establish low-impedance paths between nodes 638 and 648, and between nodes 628 and 652). Again, as discussed previously, separate drivers would be used to provide control signals to control nodes 741 and 742, and separate drivers also would be used to provide control signals to control nodes 735 and 736, according to an embodiment. At the same time, one or more drivers of the RF switch controller may send third control signals to control terminals 732 and 745 to simultaneously turn off branches 620 and 634 (i.e., to open switches 622, 635 to establish high-impedance conditions between nodes 628 and 648 and between nodes 638 and 653). Upon turning off branches 620 and 634, the balancing capacitors, if included in branches 620 and/or 634, function to balance RF voltages across the FETs of the associated branch stack(s). The RF switch controller continues to send these control signals to the various control nodes until a determination again is made (in block 1102) that the transceiver is to be configured in a transmit mode.

An embodiment of a switch circuit includes a first port, a second port, a first transistor stack coupled between the first and second ports, a first balancing capacitor, and a second transistor stack coupled in parallel with the first transistor stack between the first and second ports. The first transistor stack includes a first group of multiple first transistors and at least one additional first transistor coupled between the first and second ports. The multiple first transistors and the at least one additional first transistor all are connected together in series to provide a first variably-conductive path between the first and second ports. The first balancing capacitor has a first terminal coupled to an input of the first group of multiple first transistors, and a second terminal coupled to an output of the first group of multiple first transistors. According to a further embodiment, the second transistor stack includes a second group of multiple second transistors and at least one additional second transistor coupled between the first and second ports, and the multiple second transistors and the at least one additional second transistor all are connected together in series to provide a second variably-conductive path between the first and second ports.

Another embodiment of a switch circuit includes a first port, a second port, a first transistor stack coupled between the first and second ports, a first balancing capacitor network, a second transistor stack coupled between the first and second ports, and a second balancing capacitor network. The first transistor stack includes a first plurality of transistors coupled in series between the first and second ports to provide a first variably-conductive path between the first and second ports. The first balancing capacitor network includes one or more first capacitors, and a first capacitor of the one or more first capacitors is coupled across a first group of multiple transistors of the first plurality of transistors. The second transistor stack includes a second plurality of transistors coupled in series between the first and second ports to provide a second variably-conductive path between the first and second ports. The second balancing capacitor network includes one or more second capacitors, wherein a first capacitor of the one or more second capacitors is coupled across a second group of multiple transistors of the second plurality of transistors.

An embodiment of a transceiver includes a switch circuit. The switch circuit includes a first port, a second port, a first transistor stack coupled between the first and second ports, a first balancing capacitor, and a second transistor stack coupled in parallel with the first transistor stack between the first and second ports. The first transistor stack includes a first group of multiple first transistors and at least one additional first transistor coupled between the first and second ports. The multiple first transistors and the at least one additional first transistor all are connected together in series to provide a first variably-conductive path between the first and second ports. The first balancing capacitor has a first terminal coupled to an input of the first group of multiple first transistors, and a second terminal coupled to an output of the first group of multiple first transistors.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the foregoing technical field, background, or detailed description.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A switch circuit comprising:
   a first port;
   a second port;
   a first transistor stack coupled between the first and second ports, wherein the first transistor stack comprises a first group of multiple first transistors and at least one additional first transistor coupled between the first and second ports, wherein the multiple first transistors and the at least one additional first transistor all are connected together in series between drains and sources of transistors of the multiple first transistors and at the least one additional transistor to provide a first variably-conductive path between the first and second ports;
   a first balancing capacitor having a fixed value with a first terminal directly coupled to an input of multiple transistors of the first group of multiple first transistors and a second terminal directly coupled to an output of the multiple transistors of the first group of multiple first transistors, wherein the first terminal and the second terminal of the first balancing capacitor are directly coupled across multiple transistors of the first group of multiple first transistors, and wherein the input of the first group of multiple first transistors is directly coupled to the first port; and
   a second transistor stack coupled between the first and second ports, wherein the second transistor stack comprises a second group of multiple second transistors and at least one additional second transistor coupled between the first and second ports, wherein the multiple second transistors and the at least one additional second transistor all are connected together in series to provide a second variably-conductive path between the first and second ports; and
   a second balancing capacitor network that includes one or more second capacitors, wherein a second capacitor of the one or more second capacitors is directly coupled across a second group of multiple transistors of the second plurality of transistors.

2. The switch circuit of claim 1, wherein:
   each transistor of the first transistor stack has a gate terminal coupled to a first stack control terminal,
   each transistor of the second transistor stack has a gate terminal coupled to a second stack control terminal, and
   the switch circuit further comprises
   a first driver coupled to the first stack control terminal; and
   a second driver coupled to the second stack control terminal, where the first and second drivers are configured to simultaneously turn on or turn off the first and second pluralities of transistors.

3. The switch circuit of claim 1, wherein:
the first group of multiple first transistors includes a first transistor with a first current-conducting terminal and a second current-conducting terminal, and a second transistor with a third current-conducting terminal and a fourth current-conducting terminal;
the first terminal of the first balancing capacitor is connected to the first current-conducting terminal of the first transistor;
the second current-conducting terminal of the first transistor is electrically coupled to the third current-conducting terminal of the second transistor; and
the second terminal of the first balancing capacitor is connected to the fourth current-conducting terminal of the second transistor.

4. The switch circuit of claim 1, wherein the first group of multiple first transistors includes two transistors.

5. The switch circuit of claim 1, wherein the first group of multiple first transistors includes three or more transistors.

6. The switch circuit of claim 1, wherein the first and second transistor stacks form portions of a first branch between the first and second ports, and the switch circuit further comprises:
a third port;
a second branch coupled between the first and third ports;
a third branch coupled between the second port and a ground reference node; and
a fourth branch coupled between the third port and the ground reference node.

7. The switch circuit of claim 1, wherein each transistor of the first and second groups of transistors is a field effect transistor.

8. The switch circuit of claim 7, wherein each transistor of the first and second pluralities of transistors is a multiple-gate field effect transistor.

9. A switch circuit comprising:
a first port;
a second port;
a third port;
a first transistor stack coupled between the first and second ports, wherein the first transistor stack comprises a first group of multiple first transistors and at least one additional first transistor coupled between the first and second ports, wherein the multiple first transistors and the at least one additional first transistor all are connected together in series between drains and sources of transistors of the multiple first transistors and at the least one additional transistor to provide a first variably-conductive path between the first and second ports;
a first balancing capacitor having a fixed value with a first terminal directly coupled to an input of multiple transistors of the first group of multiple first transistors and a second terminal directly coupled to an output of the multiple transistors of the first group of multiple first transistors, wherein the first terminal and the second terminal of the first balancing capacitor are directly coupled across multiple transistors of the first group of multiple first transistors, and wherein the input of the first group of multiple first transistors is directly coupled to the first port;
a second transistor stack coupled between the first and second port; and
a third transistor stack coupled between the first and third ports, wherein the third transistor stack comprises a third group of multiple third transistors coupled in series between the first and third ports, and wherein each transistor of the third group of multiple third transistors has a gate terminal coupled to a third control terminal.

10. The switch circuit of claim 9, further comprising:
a fourth transistor stack coupled between the third port and a ground reference node, wherein the fourth transistor stack comprises a fourth group of multiple fourth transistors coupled in series between the third port and the ground reference node, and wherein each transistor of the fourth group of multiple fourth transistors has a gate terminal coupled to a fourth control terminal.

11. The switch circuit of claim 10, further comprising:
a fifth transistor stack coupled between the third port and the ground reference node, wherein the fifth transistor stack comprises a fifth group of multiple fifth transistors coupled in series between the third port and the ground reference node, and wherein each transistor of the fifth group of multiple fifth transistors has a gate terminal coupled to a fifth control terminal.

12. A switch circuit comprising:
a first port;
a second port;
a first transistor stack coupled between the first and second ports, wherein the first transistor stack comprises a first plurality of transistors connected in series between drains and sources of transistors of the first plurality of transistors and between the first and second ports to provide a first variably-conductive path between the first and second ports;
a first balancing capacitor network that includes one or more first capacitors having fixed values, wherein a first capacitor of the one or more first capacitors is directly coupled across multiple transistors within a first group of multiple transistors of the first plurality of transistors, and wherein one or more of the first capacitors is directly coupled to the first port;
a second transistor stack coupled between the first and second ports, wherein the second transistor stack comprises a second plurality of transistors coupled in series between the first and second ports to provide a second variably-conductive path between the first and second ports; and
a second balancing capacitor network that includes one or more second capacitors, wherein a second capacitor of the one or more second capacitors is directly coupled across a second group of multiple transistors of the second plurality of transistors.

13. The switch circuit of claim 12, wherein:
the first plurality of transistors includes two transistors; and
the second plurality of transistors includes two transistors.

14. The switch circuit of claim 12, wherein:
the first plurality of transistors includes three or more transistors; and
the second plurality of transistors includes three or more transistors.

15. A transceiver comprising:
a switch circuit that includes
a first port,
a second port,
a first transistor stack coupled between the first and second ports, wherein the first transistor stack comprises a first group of multiple first transistors and at least one additional first transistor coupled between the first and second ports, wherein sources and drains of the multiple first transistors and the at least one additional first transistor all are connected together in series to provide a first variably-conductive path between the first and second ports, a first balancing capacitor having a fixed value with a first terminal directly coupled to an input of multiple transistors of the first group of multiple first transistors, and a second terminal directly coupled to an output of the multiple transistors of the first group of multiple first transistors, wherein the first terminal and the second terminal of the first balancing capacitor are directly coupled across multiple transistors of the first group of multiple first transistors, and wherein the input of the first group of multiple first transistors is directly coupled to the first port; and a second transistor stack coupled in parallel with the first transistor stack between the first and second ports, wherein the second transistor stack comprises a second group of multiple second transistors and at least one additional second transistor coupled between the first and second ports, wherein the multiple second transistors and the at least one additional second transistor all are connected together in series to provide a second variably-conductive path between the first and second ports; and a second balancing capacitor network that includes one or more second capacitors, wherein a second capacitor of the one or more second capacitors is directly coupled across a second group of multiple transistors of the second plurality of transistors.

* * * * *